US009507390B2

(12) United States Patent
Jang et al.

(10) Patent No.: US 9,507,390 B2
(45) Date of Patent: Nov. 29, 2016

(54) MAGNETIC FIELD SHIELDING SHEET FOR DIGITIZER, MANUFACTURING METHOD THEREOF, AND PORTABLE TERMINAL DEVICE USING SAME

(71) Applicant: AMOSENSE CO., LTD., Cheonan-si (KR)

(72) Inventors: Kil Jae Jang, Seoul (KR); Dong Hoon Lee, Yongin-si (KR); Dong Kun Lee, Seoul (KR)

(73) Assignee: AMOSENSE CO., LTD. (KR)

( * ) Notice: Subject to any disclaimer, the term of this patent is extended or adjusted under 35 U.S.C. 154(b) by 243 days.

(21) Appl. No.: 14/371,787

(22) PCT Filed: Feb. 4, 2013

(86) PCT No.: PCT/KR2013/000870
§ 371 (c)(1),
(2) Date: Jul. 11, 2014

(87) PCT Pub. No.: WO2013/115616
PCT Pub. Date: Aug. 8, 2013

(65) Prior Publication Data
US 2014/0362505 A1 Dec. 11, 2014

(30) Foreign Application Priority Data

Feb. 3, 2012 (KR) ........................ 10-2012-0011333
Apr. 17, 2012 (KR) ........................ 10-2012-0039998

(51) Int. Cl.
*G06F 1/16* (2006.01)
*G06F 1/18* (2006.01)
(Continued)

(52) U.S. Cl.
CPC ............. *G06F 1/182* (2013.01); *G06F 1/1684* (2013.01); *H01F 10/08* (2013.01); *H05K 9/0075* (2013.01); *B82Y 25/00* (2013.01); *Y10S 977/838* (2013.01)

(58) Field of Classification Search
CPC ... B32B 37/18; B32B 37/12; B32B 38/0004; B65D 81/3446; B65D 2581/3443;
(Continued)

(56) References Cited

U.S. PATENT DOCUMENTS 5,925,455 A * 7/1999 Bruzzone ........... B65D 81/3446
252/518.1
(Continued)

FOREIGN PATENT DOCUMENTS

EP          2797092 A4 *  10/2015 ............. H01F 38/14
KR     1020050037015         4/2005
(Continued)

OTHER PUBLICATIONS

BH Curve & Iron Loss Measurements—May 2008.*
(Continued)

*Primary Examiner* — Timothy Thompson
*Assistant Examiner* — Guillermo Egoavil
(74) *Attorney, Agent, or Firm* — Cantor Colburn LLP

(57) ABSTRACT

Provided is a magnetic field shield sheet for a digitizer, which blocks an effect of a magnetic field generated from various components of a main body of the portable terminal device and at the same time improves the sensitivity of an electronic pen when a digitizer feature is implemented in the portable terminal device, while minimizing an influence upon a geomagnetic sensor. The magnetic field shield sheet includes: at least one layer thin magnetic sheet made of a nanocrystalline alloy and flake-treated so as to be separated into a plurality of fine pieces; a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape.

10 Claims, 24 Drawing Sheets

(51) Int. Cl.
*H05K 9/00* (2006.01)
*H01F 10/08* (2006.01)
*B82Y 25/00* (2011.01)

(58) Field of Classification Search
CPC .............. B65D 2581/3479; B65D 2581/3477; B65D 2581/3464; B65D 2581/3494; B82Y 25/00; H02J 5/005; H02J 7/0052; H02J 7/0042; H02J 7/025; H04B 5/0037; H05B 6/649; H05K 9/0088; H05K 9/0081; H01F 10/08; H01F 27/365; H01F 38/14; H01Q 1/22; H01Q 7/08; H01Q 7/06; H01Q 17/00; G06F 1/1684; G06F 1/182; G06K 19/07771; Y10S 977/838; Y10T 156/10; Y10T 428/256; Y10T 428/261; Y10T 428/25; Y10T 428/249956; Y10T 428/2848; Y10T 428/249955
USPC ........... 156/62.2; 174/377; 252/62.56, 518.1; 361/679.4; 428/328, 704, 333, 699, 428/900; 524/435; 977/838
See application file for complete search history.

(56) References Cited

U.S. PATENT DOCUMENTS

2010/0288418 A1* 11/2010 Yang ................ G06K 19/07771
156/62.2
2011/0138615 A1    6/2011 Sohn et al.

FOREIGN PATENT DOCUMENTS

| KR | 1020080072556 | 8/2008 |
| KR | 1020100048440 | 5/2010 |
| KR | 1020110038978 | 4/2011 |
| KR | 1020110092833 | 8/2011 |

OTHER PUBLICATIONS www_electronics-tutorials_ws—Dec. 2011.*
International Search Report—PCT/KR2013/000870 dated Apr. 30, 2013.

* cited by examiner

MAGNETIC FIELD SHIELDING SHEET FOR DIGITIZER, MANUFACTURING METHOD THEREOF, AND PORTABLE TERMINAL DEVICE USING SAME

TECHNICAL FIELD

The present invention relates to a magnetic field shield sheet for a digitizer, a method of manufacturing the magnetic field shield sheet, and a portable terminal device using the magnetic field shield sheet, and more particularly to, a magnetic field shield sheet for a digitizer, which blocks an effect of a magnetic field generated from various components of a main body of the portable terminal device and at the same time improves the sensitivity of an electronic pen when a digitizer feature is implemented in the portable terminal device, while minimizing an influence upon a geomagnetic sensor, a method of manufacturing the magnetic field shield sheet, and a portable terminal device using the magnetic field shield sheet.

BACKGROUND ART

In recent years, portable terminal devices such as smart phones with a digitizer feature have been commercialized and become popular in the market. A digitizer using an electronic pen enables a user to draw a line of about 0.7 mm thick and thus is more precise than a capacitive type touch panel recognizing a line of 3-4 mm thick, to thereby perform a fine work easily.

In addition, it is possible to take handwritten notes, to draw a picture, and edit an image or photo, by using an electronic pen such as a stylus. Furthermore, pressure of a force applied to the electronic pen is detected when a user holds the electronic pen in hand to write a letter and thus thickness of the letter varies depending on the detected force, to thereby enable a work with a high resolution.

To implement such a digitizer feature, a digitizer panel is provided at a lower side of a touch screen/display panel. In addition, since the digitizer panel is formed of a thin metal film, a feeble electromagnetic field is created when the digitizer panel conducts electricity, and since a built-in ultra-small metal coil is provided at the end of the portable electronic pen, an alternating magnetic field is generated in use.

Thus, when the tip of the electronic pen is close to the touch screen, the electromagnetic induction phenomenon occurs, while deformation of the electromagnetic field that has already been formed occurs on the digitizer panel disposed below the touch screen/display panel. Here, deformation of the electromagnetic field is detected through a sensor arranged at a side edge of the digitizer panel to thereby be interpreted as the actual movement of the electronic pen.

This digitizer feature is being applied to a large screen tablet personal computer (PC) employing a large display as well as a small portable terminal device such as a smart phone.

In order to use a digitizer feature using an electromagnetic induction phenomenon in a portable terminal device, a magnetic field shield sheet for shielding an electromagnetic field generated from various components of a main body of the portable terminal device, is inserted and used between the digitizer panel and a main circuit board. The main body of the portable terminal device has a variety of communication chips and antennas and generates an electromagnetic field for wireless communications.

Recently, a spread of a long-term evolution (LTE) implementing a fourth generation mobile communication technology uses radio waves much stronger than a conventional wireless communication terminal using of the 3G mobile communication system. Accordingly, an influence upon a digitizer from the strong electromagnetic field is precluded, and a reliable magnetic field shield is required for smooth magnetic field communications between the stylus and the digitizer.

Meanwhile, the portable terminal device includes a geomagnetic sensor in order to implement functions such as navigation or augmented reality by using GPS (Global Positioning System) technologies. In addition, in the case of smart phones employing the Android operating system (OS), it is an essential condition to adopt the geomagnetic sensor.

Since the magnetic field shield sheet is formed of a size corresponding to a digitizer, i.e., a display so as not to influence upon a digitizer function, it is difficult to design a gap between the magnetic field shield sheet and the geomagnetic sensor in the inside of the portable terminal device to become 2 mm or longer.

However, in the case that the magnetic field shield sheet is used in the portable terminal device in the proximity of and together with the geomagnetic sensor, the magnetic field shield sheet affects the geomagnetic sensor thereby causing the malfunction in the geomagnetic sensor.

In other words, the geomagnetic sensor can cause azimuth distortion, sensor sensitivity distortion, and magnetic hysteresis distortion by the magnetic field shield sheet.

The azimuth distortion means a phenomenon of distorting direction of the magnetic north due to the magnetic field shield sheet, the sensor sensitivity distortion means a phenomenon of distorting sensitivity among X-, Y-, Z-axis sensors constituting the geomagnetic sensor, since the strength of the magnetic field is also changing due to the magnetic field shield sheet, and the magnetic hysteresis distortion means a phenomenon of making an error in the azimuth depending on the direction of rotation of the sensor because of the magnetic hysteresis of a magnetic substance.

Accordingly, in order to prevent the distortion of the geomagnetic sensor and in order to measure accurate azimuth, it is necessary to correct the geomagnetic sensor. However, it is possible to correct the azimuth distortion and the sensor sensitivity distortion accurately, but it is difficult to correct the magnetic hysteresis distortion accurately, to thereby weight an error of the geomagnetic sensor.

It is general to use a magnetic substance such as heatless treatment Fe-based and Co-based amorphous ribbons, ferrite sheets, or polymer sheets containing magnetic powder, as the magnetic field shield sheet. A magnetic field focusing effect to improve performance of a magnetic field shielding function and a digitizer feature, may be good in the order of high magnetic permeability Fe-based and Co-based amorphous ribbons, ferrite sheets, and polymer sheets containing magnetic powder.

The heatless treatment Fe-based and Co-based amorphous ribbons are metal sheets in themselves, and thus, have no burden to the thickness. However, the heatless treatment Fe-based and Co-based amorphous ribbons have too large magnetic permeability, and thus affect the geomagnetic sensor. As a result, the heatless treatment Fe-based and Co-based amorphous ribbons are not used ad the magnetic field shield sheets. In addition, the ferrite sheets also have too large magnetic permeability and thus affect the geomagnetic sensor. In addition, the ferrite sheets also have drawbacks of getting thick.

Thus, the conventional magnetic field shield sheet employs a polymer sheet containing magnetic powder of a relatively poor magnetic permeability. However, when compared with the Fe-based and Co-based amorphous ribbons, the polymer sheet has low magnetic permeability, to thereby cause a problem that an electronic pen such as a stylus is very expensive and sensitivity of the stylus is degraded to the half (½).

In addition, since the polymer sheet has low magnetic permeability, when compared with the Fe-based and Co-based amorphous ribbons, the polymer sheet gets thick in comparison with the Fe-based and Co-based amorphous ribbons that are thin plates of several tens of micrometers (μm) in order to improve the performance of the low magnetic permeability. Accordingly, it is difficult to cope with the trend that the terminals get thin, and the material cost is further increased due to an increase of the thickness.

Meanwhile, the magnetic hysteresis phenomenon means that a magnetic body has a hysteresis that magnetic induction values in the inside of the magnetic body do not match each other when a magnetic field is applied to the magnetic body through a rise and fall of the magnetic field, and may occur in the case that the magnetic field is applied to the magnetic body until to the magnetic body is saturated. In the case that the magnetic field does not reaches a saturation region, the magnetic induction values are repeatedly increased and decreased without causing any hysteresis along an initial magnetization curve.

In the case of the heatless treatment Fe-based amorphous ribbon among the amorphous ribbons, a value of a saturation field (Hs) that is the minimum magnetic field to obtain the saturation induction is about 0.4 G that is lower than the earth magnetic field having a value of about 0.5 G, in a magnetic hysteresis loop.

Therefore, the Fe-based amorphous ribbon sheet exhibits the magnetic hysteresis phenomenon even in the case of the change in the earth magnetic field, with the result that a geomagnetic sensor used in a terminal to which a Fe-based amorphous ribbon sheet is applied, has a fatal disadvantage that even the magnetic hysteresis phenomenon due to the Fe-based amorphous ribbon sheet should be corrected.

In addition, in the case that Fe-based and Co-based amorphous ribbon sheets are used, the geomagnetic sensor causes an azimuth hysteresis phenomenon that is generated according to the rotational direction of the geomagnetic sensor in the X-axis, Y-axis, and Z-axis sensed values when the geomagnetic sensor is rotated in the clockwise direction and the counterclockwise direction, and an azimuth hysteresis phenomenon is not accurately calibrated thereby weighting errors to the sensor operation.

Meanwhile, Korea Patent Laid-open Publication No. 10-2011-92833 proposed an electromagnetic wave absorbing sheet containing a Fe-based nanocrystalline soft magnetic powder and a carbon-based conductive material powder. The Fe-based nanocrystalline soft magnetic powder is formed of a Fe—Si—B—Nb—Cu-based alloy as an amorphous alloy. The Fe—Si—B—Nb—Cu-based alloy is preliminarily heat treated at a temperature of 350° C. to 500° C. for 45-90 minutes, to thus obtain alloy powders, the alloy powders are primarily and secondarily crushed, and then the crushed powders are meshed to be 270 mesh in particle size, to thereby obtain Fe-based nanocrystalline soft magnetic powders having nano-sized crystal grains.

The electromagnetic wave absorbing sheet is made to have a thickness of 0.5 mm, to thus absorb 10 MHz to 10 GHz band electromagnetic waves.

However, the electromagnetic wave absorbing sheet is simply used to absorb the high frequency band electromagnetic waves, and employs a kind of the polymer sheet that is made to have a thickness of 0.5 mm by mixing a Fe-based nanocrystalline soft magnetic powder having nano-sized crystal grains, with a binder. As a result, the electromagnetic wave absorbing sheet gets thick when compared with the case of using the amorphous ribbon sheet (whose thickness is about 0.06 mm or less), and also has the low magnetic permeability due to the mixture of the binder.

Korea Patent Laid-open Publication No. 10-2005-37015 discloses a metal and polymer composite having a low frequency magnetic field shielding function, wherein at least one selected from Permalloy®, Sendust®, and a rapidly solidified alloy that are metal alloys having a high magnetic permeability is included by 10 to 80 wt % in a powdered, flaky or fibrous form; a soft polymer material is included by 15 to 65 wt % as a matrix where the metal alloys are dispersed; and various additives are included by 5 to 25 wt % in order to be used to mix the metal alloys and the soft polymer material.

Further, the Permalloy® is magnetically heat treated under the magnetic field of 300 to 600 gauss and at a temperature of 600 to 1100° C. for 1-2 hours, the Sendust® is magnetically heat treated under the magnetic field of 100 to 600 gauss and at a temperature of 500 to 1100° C. for 1-2 hours, and the rapidly solidified alloy is magnetically heat treated under the magnetic field of 100 to 600 gauss and at a temperature of 300 to 500° C., for 1-2 hours. ° C.

The metal and polymer composite includes a metal alloy and a polymer material in a powdered, flaky or fibrous form, and thus has the same problem as the polymer sheet.

The aforementioned prior art discloses an electromagnetic wave absorbing sheet or a magnetic field shield sheet. However, when both an electronic pen function (i.e., a stylus function) and a navigation function are implemented in a portable terminal device such as a smart phone, the above-described conventional magnetic field shield sheet does not propose a possible solution to the problems that a distortion problem for the geomagnetic sensor is present, the thickness of the magnetic field shield sheet gets thick, and the material cost for the magnetic field shield sheet is very expensive.

Taking into account that the distortion of the azimuth and the sensor sensitivity distortion among the distortions that occur in the geomagnetic sensor due to the shield sheet can be accurately corrected, but the directional hysteresis due to the magnetic hysteresis phenomenon cannot be accurately corrected, the inventor(s) has tried to develop shield sheets that do not cause the distortion problem due to the magnetic hysteresis phenomenon, and seen that there may be little change in the magnetic permeability even though the thin-film ribbon is flaked in the case of the nanocrystalline ribbon and there is no distortion problem due to the magnetic hysteresis phenomenon because of no magnetic saturation, which leads the inventor(s) to the present invention.

In the case of using a digitizer function in the smart phone such as the conventional tablet PC or the tablet phone, the digitizer function is not activated until a sufficient force is applied onto tempered glass provided on a touch screen panel or a display panel with the tip of the electronic pen so as to feel pressure of the tip of the electronic pen. In addition, thickness of the character may be changed by detecting the intensity of the pressure of the tip of the electronic pen. Therefore, it is required to implement a contactless pen function for ease of use, improvement of durability, and improvement of sensitivity of the digitizer function.

DISCLOSURE

Technical Problem

To solve the above problems or defects, it is an object of the present invention to provide a magnetic field shield sheet for a digitizer, and a manufacturing method thereof, which enables a B—H loop (i.e., a curve between the magnetic flux density and the magnetic field intensity) to be changed in an initial magnetization curve, shield sheets of desired specific magnetic permeability to be easily manufactured, and the magnetic permeability of shield sheets to be selected widely, by performing superheating treatment at a temperature above a critical temperature, when a nanocrystalline ribbon having a nanocrystalline microstructure is manufactured by heat treatment of an amorphous alloy ribbon or strip.

It is another object of the present invention to provide a magnetic field shield sheet for a digitizer, which can shield an electromagnetic field generated from various components of a main body of a portable terminal device when a digitizer function is implemented in the portable terminal device, while minimizing an influence upon a geomagnetic sensor, and can improve the sensitivity of an electronic pen such as a stylus, a manufacturing method thereof, and a portable terminal device having a digitizer function.

It is still another object of the invention to provide a portable terminal device having a magnetic field shield sheet for a digitizer, which does not nearly generate measurement errors of the azimuth of a geomagnetic sensor due to a magnetic hysteresis phenomenon in a heatless treatment Fe-based or Co-based amorphous ribbon, and which establishes a magnetic permeability of the magnetic field shield sheet to be higher than a polymer sheet, and to be equal to or higher than the heatless treatment Fe-based or Co-based amorphous ribbon, so as to absorb a magnetic flux required to perform a digitizer function at a high sensitivity, to thereby enable the digitizer function to be performed at a non-contact state of a wireless electronic pen on a display surface of the portable terminal device, and to thus achieve ease of use and improvement of durability.

It is yet another object of the invention to provide a magnetic field shield sheet for a digitizer, and a manufacturing method thereof, which can maximize a magnetic permeability for a magnetic shielding function by using a nanocrystalline ribbon having a nanocrystalline microstructure that is obtained by heat treating an amorphous alloy ribbon or strip, and which can increase a demagnetizing field by a flake treatment process so as not to achieve magnetic saturation, to thus block a distortion problem due to a magnetic hysteresis phenomenon.

It is yet still another object of the invention to provide a magnetic field shield sheet for a digitizer, and a manufacturing method thereof, which fills a gap between fine pieces of a nanocrystalline ribbon with an adhesive by performing a flake treatment process of the nanocrystalline ribbon and then by performing a compression laminating process, to thereby prevent water penetration, and which simultaneously surrounds all surfaces of the fine pieces with the adhesive (or the dielectric) to thus mutually isolate the fine pieces to thereby promote reduction of eddy currents and prevent shielding performance from falling.

It is a further object of the present invention to provide a magnetic field shield sheet for a digitizer, and a manufacturing method thereof, which sequentially performs a flake treatment process and a laminating process by using a roll-to-roll method, to thereby achieve a sheet molding process to thus maintain original thickness of the sheet and to thus exhibit high productivity and inexpensive manufacturing costs.

Technical Solution

To accomplish the above and other objects of the present invention, according to an aspect of the present invention, there is provided a magnetic field shield sheet for a digitizer, comprising:

at least one layer thin magnetic sheet made of a nanocrystalline alloy and flake-treated so as to be separated into a plurality of fine pieces;

a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein the thin magnetic sheet is obtained by heat treating a nanocrystalline ribbon made of the nanocrystalline alloy at a temperature of 300° C. to 700° C.

According to another aspect of the present invention, there is provided a method of manufacturing a magnetic field shield sheet for a digitizer, the method comprising the steps of:

heat treating at least one nanocrystalline ribbon sheet made at a temperature of 300° C. to 700° C. for 30 minutes to 2 hours, to thereby form a thin magnetic sheet formed of nanocrystalline microstructures;

adhering a protective film and a double-sided tape formed of a release film on an exposed surface of the double-sided tape, respectively, on both sides of the thin magnetic sheet, to thereby form a laminate sheet;

performing a flake treatment process of the laminate sheet to thus separate the thin magnetic sheet into a plurality of fine pieces; and laminating the flake treated laminate sheet, wherein the laminate sheet is flattened and slimmed by lamination of the laminate sheet and some parts of first and second adhesive layers are filled into gaps among the plurality of fine pieces, to thereby isolate the plurality of fine pieces.

According to still another aspect of the present invention, there is provided a portable terminal device having a digitizer function, the portable terminal device comprising:

at least one layer first magnetic sheet made of a nanocrystalline alloy and flake-treated so as to be separated into a plurality of fine pieces;

a protective film that is adhered on one surface of the first magnetic sheet via a first adhesive layer provided on one side of the protective film; and a double-sided tape that is adhered on the other surface of the first magnetic sheet via a second adhesive layer provided on one side of the double-sided adhesive tape, wherein some parts of first and second adhesive layers are filled into gaps among the plurality of fine pieces, to thereby isolate the plurality of fine pieces, and a B—H loop that is a curve between a magnetic flux density and a magnetic field intensity of the first magnetic sheet is changed in an initial magnetization curve.

Advantageous Effects

As described above, the present invention provides a magnetic field shield sheet that does not cause a distortion problem due to a magnetic hysteresis phenomenon, by considering that an azimuth distortion and a sensor sensitivity distortion among distortions that occur in a geomagnetic sensor due to the magnetic field shield sheet can be accurately corrected, but the directional hysteresis due to the magnetic hysteresis phenomenon cannot be accurately corrected. As a result, the magnetic field shield sheet according to the present invention does not generate a distortion problem due to a magnetic hysteresis phenomenon but generates only an azimuth distortion and sensor sensitivity distortion, to thus solve the distortions through compensation and to thereby implement a distortion-free navigation function.

To this end, the present invention performs superheating treatment at a temperature above a critical temperature, when a nanocrystalline ribbon sheet having a nanocrystalline microstructure is manufactured by heat treatment of an amorphous alloy ribbon or strip, to thereby enable a B—H loop (i.e., a curve between the magnetic flux density and the magnetic field intensity) to be changed in an initial magnetization curve, shield sheets of desired specific magnetic permeability to be easily manufactured, and the magnetic permeability of shield sheets to be selected widely.

In addition, the present invention can control a magnetic permeability of a shield sheet according to a heat treatment temperature into a desired value, to thus easily control the magnetic permeability of the shield sheet so as to absorb a magnetic flux required to perform a digitizer function at a high sensitivity.

Further, the magnetic field shield sheet of the present invention can shield an electromagnetic field generated from various components of a main body of a portable terminal device when a digitizer function is implemented in the portable terminal device, while minimizing an influence upon a geomagnetic sensor, and can improve the sensitivity of an electronic pen such as a stylus, on behalf of a polymer sheet that is expensive and has a low magnetic permeability, and a heatless treatment Fe-based or Co-based amorphous ribbon sheet having an advantage in the thickness and excellent magnetic permeability characteristics but generating a magnetic hysteresis distortion in a geomagnetic sensor.

Considering magnetic permeability characteristics do not almost change although the thin ribbon is flaked, in the case of nanocrystalline ribbon, the surface resistance of the ribbon is heightened by heat treatment and the ribbon is flake-treated after the heat-treatment, to thereby reduce the surface area of the ribbon, to thus increase a demagnetizing field to prevent magnetic saturation, and to thus reduce losses due to eddy current.

To this end, the present invention can maximize a magnetic permeability for a magnetic shielding function by using a nanocrystalline ribbon having a nanocrystalline microstructure that is obtained by heat treating an amorphous alloy ribbon or strip, and can increase a demagnetizing field by a flake treatment process so as not to achieve magnetic saturation, to thus block a distortion problem due to a magnetic hysteresis phenomenon.

A nanocrystalline ribbon sheet of the present invention is separated into a number of fine pieces and/or is formed of cracks, through a flake treatment process. For this reason, even in the case that a magnetic field is applied from the outside along one side of the nanocrystalline ribbon sheet, the magnetic field is attenuated while passing through a number of the fine pieces, and thus is not nearly dissipated on the opposite side of the nanocrystalline ribbon sheet to which the magnetic field has been applied.

As a result, the present invention has little effect on the geomagnetic sensor even in the case that a magnetic field is applied from the outside along one side of the nanocrystalline ribbon sheet, when the magnetic field shield sheet having a nanocrystalline ribbon sheet is used in a portable terminal device.

In the present invention, differently from a heatless treatment Fe-based or Co-based amorphous ribbon, the shield sheet does not generate a magnetic hysteresis phenomenon, and thus errors of the azimuth of the geomagnetic sensor can be removed through a compensation algorithm. In addition, the shield sheet according to the present invention has a higher magnetic permeability characteristic than the polymer sheet, to thereby improve a pen function, and provide an advantage that the azimuth errors of the geomagnetic sensor are not almost generated.

In the case that the nanocrystalline ribbon that is manufactured through such a heat treatment and flake treatment process is used as a magnetic field shield sheet, the losses due to the eddy current are greatly reduced. Accordingly, performance of the digitizer function is maximized and the magnetic field is shielded, to thereby implement a portable terminal device so as not to affect components such as a battery in the portable terminal device.

In addition, the present invention does not nearly generate measurement errors of the azimuth of a geomagnetic sensor due to a magnetic hysteresis phenomenon in a Fe-based or Co-based amorphous ribbon, and establishes a magnetic permeability of the magnetic field shield sheet to be higher than a polymer sheet, and to be equal to or higher than the Fe-based or Co-based amorphous ribbon, so as to absorb a magnetic flux required to perform a digitizer function at a high sensitivity, to thereby enable a wireless electronic pen to be performed at a non-contact state on a display surface of the portable terminal device, and to thus achieve ease of use and improvement of durability.

Moreover, the present invention fills a gap between fine pieces of a nanocrystalline ribbon with an adhesive by performing a flake treatment process of the nanocrystalline ribbon and then by performing a compression laminating process, to thereby prevent water penetration, and simultaneously surrounds all surfaces of the fine pieces with the adhesive (or the dielectric) to thus mutually isolate the fine pieces to thereby promote reduction of eddy currents and prevent shielding performance from falling.

In addition, the present invention sequentially performs a flake treatment process and a laminating process by using a roll-to-roll method, to thereby achieve a sheet molding process to thus maintain original thickness of the sheet and to thus exhibit high productivity and inexpensive manufacturing costs.

BEST MODE

Figure 1:
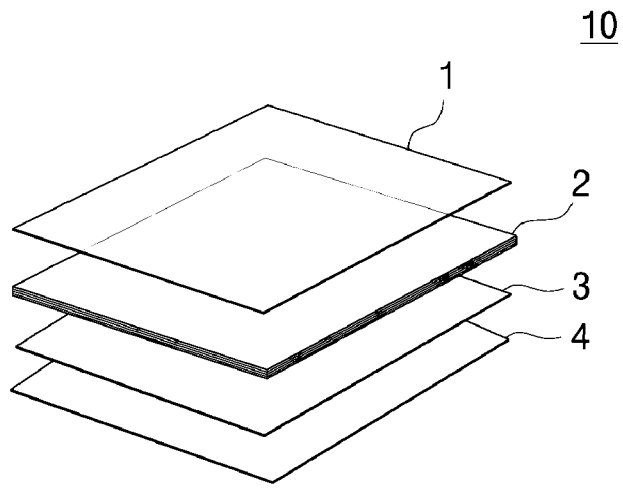
FIG. 1 is an exploded perspective view showing a magnetic field shield sheet for a digitizer according to a preferred embodiment of the present invention.

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Referring to FIGS. 1 to 5, a magnetic field shield sheet 10 according to an embodiment of the present invention includes: at least one layer or a double-layer nanocrystalline ribbon sheet 2, by thermally treating an amorphous alloy ribbon or strip (hereinafter, simply called a "ribbon") as a thin magnetic sheet, to have nanocrystalline microstructures, and then performing a flake treatment process to be separated and/or cracked into a plurality of fine pieces 20; a protective film 1 that is adhered on one side of the nanocrystalline ribbon sheet 2; a double-sided tape 3 that is adhered on the other side of the nanocrystalline ribbon sheet 2; and a release film 4 that is adhered on an exposed surface of the double-sided tape 3.

Further, when the nanocrystalline ribbon sheet 2 is a two-layer structure, the double-sided tape is inserted in the intermediate portion of the two-layer structure.

Meanwhile, a thin ribbon made of a Fe-based nanocrystalline magnetic alloy can be used as the nanocrystalline ribbon sheet 2.

An alloy satisfying the following Equation 1 is preferably used as the Fe-based nanocrystalline magnetic alloy.

$$Fe_{100-c-d-e-f-g}A_cD_dE_eSi_fB_gZ_h \qquad \text{Equation 1}$$

In Equation 1, an element A is at least one element selected from Cu and Au, an element D is at least one element selected from Ti, Zr, Hf, V, Nb, Ta, Cr, Mo, W, Ni, Co, and rare earth elements, an element E is at least one element selected from Mn, Al, Ga, Ge, In, Sn, and platinum group elements, an element Z is at least one element selected from C, N, and P, c, d, e, f, g, and h are numbers that satisfy the following relational expressions $0.01 \leq c \leq 8$ at %, $0.01 \leq d \leq 10$ at %, $0 \leq e \leq 10$ at %, $10 \leq f \leq 25$ at %, $3 \leq g \leq 12$ at %, $15 \leq f+g+h \leq 35$ at %, respectively, and the alloy structure of an area ratio of 20% or more is formed of the fine structure of the particle size of equal to or less than 50 nm.

In the aforementioned Equation 1, the element A is used to enhance corrosion resistance of the alloy, to prevent coarsening of crystal grains and at the same time, improve the magnetic properties such as the iron loss and the permeability of the alloy. When the content of the element A is too small, it is difficult to obtain the effect of suppressing coarsening of crystal grains. Conversely, when the content of the element A is excessively large, the magnetic properties are degraded. Thus, it is preferable that the content of the element A is in the range from 0.01 to 8 at %. The element D is an element that is effective for the uniformity of the crystal grain diameter, the reduction of magnetostriction, etc. It is preferable that the content of the element D is in the range from 0.01 to 10 at %.

The element E is an element that is effective for the soft magnetic properties of the alloy and improvement of corrosion resistance of the alloy. The content of the element E is preferably not more than 10 at %. The elements Si and B are elements that make the alloy to become amorphous at the time of producing the magnetic sheet. It is preferable that the content of the element Si is in the range from 10 to 25 at %, and it is preferable that the content of the element B is in the range from 3 to 12 at %. In addition, it may include the element Z as an element that makes the alloy to become amorphous, other than Si and B. In that case, the total content of the elements Si, B and Z is preferably in the range of 15 to 35 at %. It is preferable to implement the microcrystalline structure that crystal grains whose grain diameters are in the range of 5 to 30 nm exist in the range of 50 to 90% as an area ratio in the alloy structure.

Further, a Fe—Si—B—Cu—Nb alloy can be used as a Fe-based nanocrystalline magnetic alloy that is used in the nanocrystalline ribbon sheet 2, and in this case, it is preferable that the content of Fe is 73-80 at %, the content of the sum of Si and B is 15-26 at %, and the content of the sum of Cu and Nb is 1-5 at %. An amorphous alloy that is obtained by producing such a composition range in the form of a ribbon can be easily precipitated into nanocrystalline grains by a thermal treatment to be described later.

Figure 2:
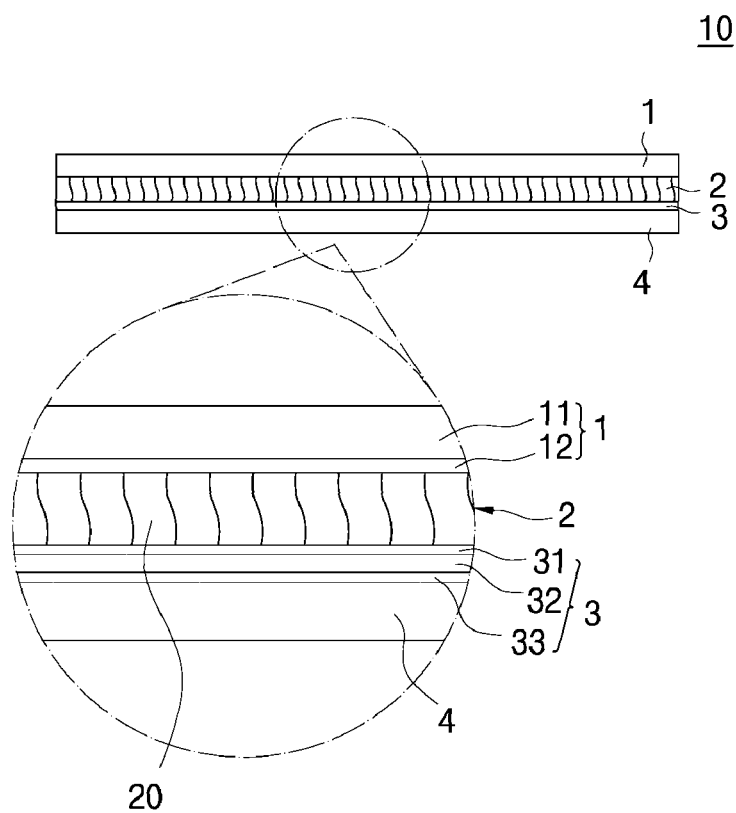
FIG. 2 is a cross-sectional view showing a first example of using one piece of nanocrystalline ribbon sheet in FIG. 1.

As shown in FIG. 2, a magnetic field shield sheet 10 according to a first example of the present invention has a structure that one nanocrystalline ribbon sheet 2 is used in which a protective film 1 is bonded on one side of the nanocrystalline ribbon sheet 2, and a release film 4 is bonded via a double-sided tape 3 on the other side of the nanocrystalline ribbon sheet 2.

In the case of a large display having a big area than a smartphone, for example, a portable terminal device with a width of 100 mm, two magnetic field shield sheets 10 according to the first example of the present invention each sheet having a 50 mm width are butted or overlapped with each other in the longitudinal direction. Since currently produced amorphous ribbons are typically about 50 mm wide, two sheets are butted in the longitudinal direction, to thus cover the magnetic field shield sheet 10 for the portable terminal device having a width of 100 mm.

Figure 3A:
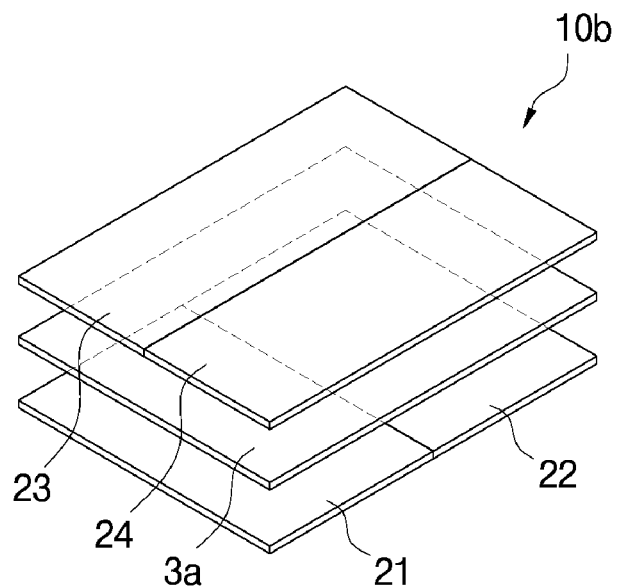
FIG. 3A is an exploded perspective view illustrating a magnetic field shield sheet at a state where a protective film and a release film have been removed as a second example of using a nanocrystalline ribbon sheet of a two-layer structure in FIG. 1.
Figure 3B:
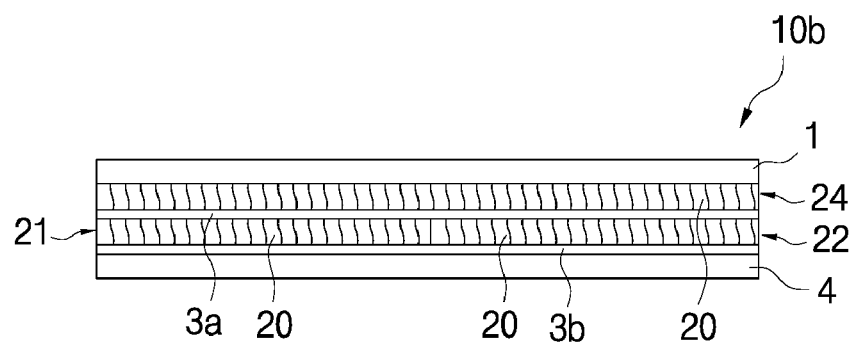
FIG. 3B is a cross-sectional view illustrating an assembled magnetic field shield sheet at a state where a protective film and a release film have been removed as a second example of using a nanocrystalline ribbon sheet of a two-layer structure in FIG. 1.

Furthermore, in the case of constituting a magnetic field shield sheet 10b for a portable terminal device with a width of 100 mm like the second example as shown in FIGS. 3A and 3B, first and second nanocrystalline ribbon sheets 21 and 22 are connected in a butting or overlapping manner in a first layer as two magnetic sheets, a wide-width double-sided tape 3a is stacked over the first layer, and third and fourth nanocrystalline ribbon sheets 23 and 24 are connected in a butting or overlapping manner so as to cross in a direction perpendicular to the first and second nanocrystalline ribbon sheets 21 and 22. In this manner, the magnetic field shield sheet 10b for the wide-width portable terminal device can be configured.

As described above, a number of nanocrystalline ribbon sheets 21-24 are stacked and used, the double-sided tape 3a is inserted between a plurality of nanocrystalline ribbon sheets 21-24 as in the second example of the present invention.

Figure 4:
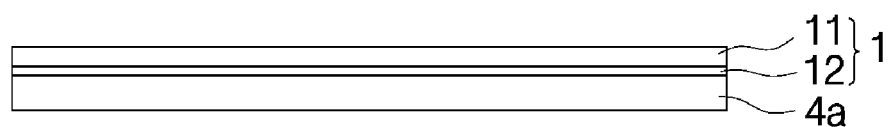
FIGS. 4 and 5 are cross-sectional views showing the structure of a protective film and a double-sided tape that are respectively used in the present invention.

As shown in FIG. 4, the protective film 1 may be implemented by using a base member 11 including a polyethylene terephthalate (PET) film, a polyimide film, a polyester film, polyphenylene sulfade (PPS) film, a polypropylene (PP) film, or a fluorine resin-based film such as poly terephthalate (PTFE). A first adhesive layer 12 is attached to one side of the protective film 1. When the protection film 1 is attached on one side of the nanocrystalline ribbon sheet 2, or 21-24, a release film 4a attached on the other surface of the first adhesive layer 12 to protect the first adhesive layer 12 is removed and then the protection film 1 is attached on one side of the nanocrystalline ribbon sheet.

Further, the protective film 1 is 1 to 100 μm, in thickness, and it is preferably in the range of 10-30 μm, and it is more preferable to have a thickness of 20 μm.

Figure 5:
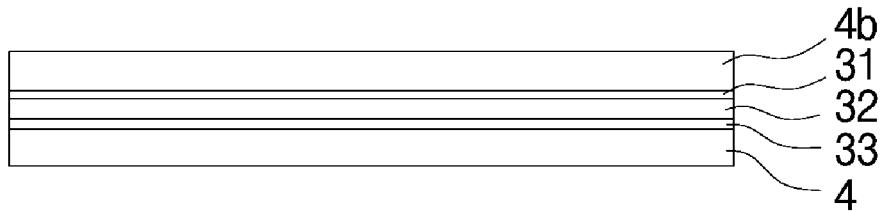

Further, as shown in FIG. 5, the double-sided tape 3, 3a, or 3b is formed of a base member 32 made of a fluorine resin-based film, for example, a PET (Polyethylene Terephthalate) film, on both sides of which second and third adhesive layers 31 and 33 are formed. Release films 4 and 4b are attached on the outer surfaces of the second and third adhesive layers 31 and 33, respectively, in order to protect the second and third adhesive layers 31 and 33.

When the double-sided tape 3a or 3b is inserted between the nanocrystalline ribbon sheets 21-24 in order to interconnect the nanocrystalline ribbon sheets 21-24, the release films 4 and 4b on both sides of the double-sided tape 3a or 3b are peeled off and removed. The double-sided tape 3b coupled to the exterior of the nanocrystalline ribbon sheets 21 and 22 at the lowermost portion of the stacked nanocrystalline ribbon sheets 21-24, is made at a state where the release film 4 is attached in order to protect a third adhesive layer 33 exposed to the outside.

The double-sided tapes 3, 3a and 3b may be a type of including a base member as described above, but may be a type of including no base member but being formed of only adhesive layers. In the case of the double-sided tapes 3a and 3b interposed between the nanocrystalline ribbon sheets 21-24, it is preferable to use no-base type double-sided tapes in terms of a thinning process.

The adhesive layers 3, 31, and 33 that are used for the protective film 1 and the release film 4 may be implemented by using, for example, acrylic adhesives, but may be of course possibly implemented by using different types of adhesives.

The double-sided tapes 3, 3a, and 3b may have 10, 20, 30 μm thick, preferably have a thickness of 10 μm.

Figure 17:
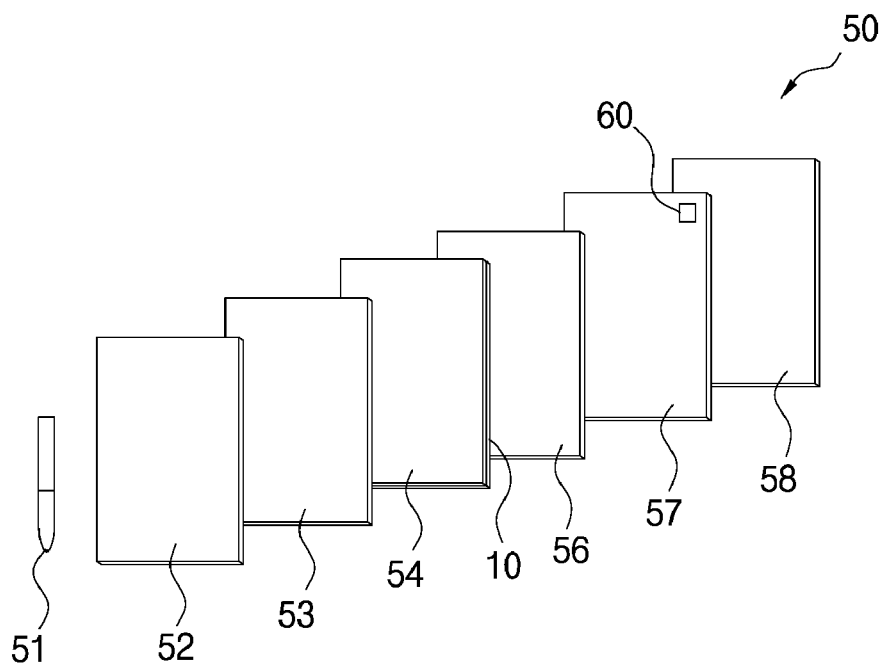
FIG. 17 is a schematic exploded perspective view of the structure that a magnetic field shield sheet according to the present invention is applied to a portable terminal device having a digitizer function.

As shown in FIGS. 1 to 3, the magnetic field shield sheet 10, 10a, or 10b according to the embodiment of the present invention may be made into a rectangular shape in correspondence to a digitizer 54 of FIG. 17, and has preferably a shape corresponding to a shape of a portion required for shielding a magnetic field.

One piece of the nanocrystalline ribbon sheet 2 that is used for the magnetic field shield sheet 10, 10a or 10b may have a thickness of 15 to 35 μm for example. In this case, in consideration of a handling process after the heat treatment of the nanocrystalline ribbon sheet 2, and a treatment process when two or more ribbons are overlapped, a thickness of the nanocrystalline ribbon sheet 2 is preferably set to be in the range of 25 to 30 μm. The thinner the thickness of the ribbon may become, a breakage phenomenon of the ribbon may occur due to even a little shock at the time of performing a handling process after the heat treatment. Especially, in the case that two pieces of ribbons are overlapped, the mating surface of the ribbons may become wrinkled due to the thin ribbons, to thereby cause handling difficulties.

Figure 6:
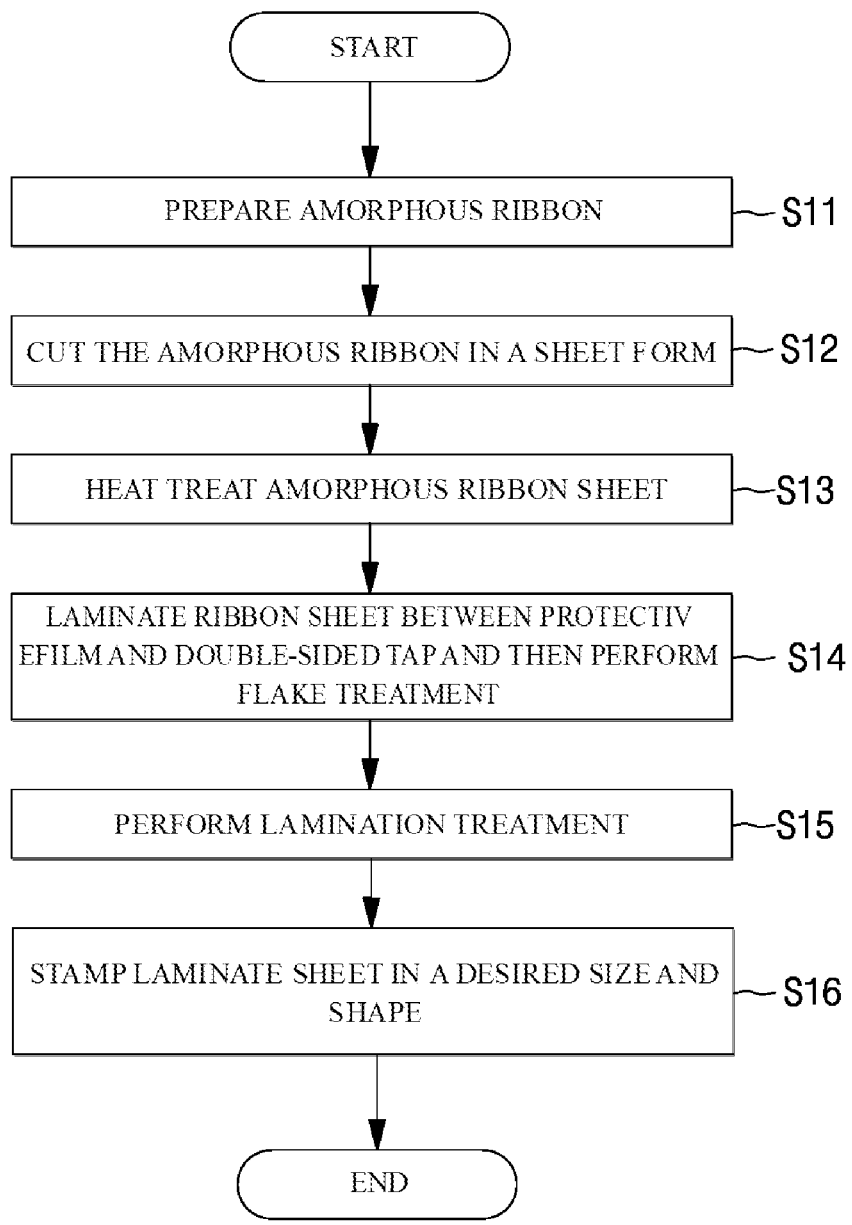
FIG. 6 is a flowchart view for describing a process of manufacturing a magnetic field shield sheet according to the present invention.

Hereinafter, a method of manufacturing a magnetic field shield sheet 10 according to the embodiment of the present invention, will be described with reference to FIG. 6.

First, an ultra-thin amorphous ribbon equal to or less than 30 μm made of a nanocrystalline alloy as a Fe-based amorphous ribbon, e.g., a Fe—Si—B—Cu—Nb alloy is prepared by a rapidly solidification process (RSP) due to melt spinning (S11), and is cut in a predetermined length to then be laminated in a sheet form (S12) so that post-processing after a heat treatment can be easily performed.

Then, the laminated amorphous ribbon sheet is heat treated at a temperature of 300° C. to 700° C. for 30 minutes to 2 hours thereby forming the nanocrystalline ribbon sheet 2 or 21-24 formed of nanocrystalline grains (S13).

The nanocrystalline ribbon sheet 2 or 21-24 is obtained through a method of making a nanocrystalline alloy in a ribbon or strip form, and heat treating the nanocrystalline alloy of the ribbon or strip form under a none-magnetic field circumstance, at a heat treatment temperature interval (Tp) of 300° C. to 700° C. for 30 minutes to 2 hours, to thereby precipitate fine crystal grains. In this case, since content of Fe is more than 70 at %, if heat treatment is made in the air in view of the heat treatment atmosphere, oxidation is made to thereby cause an undesirable situation in terms of visual aspects. Thus, the heat treatment is preferably performed in a nitrogen atmosphere. However, even if the heat treatment is made under an oxidizing atmosphere, permeability of the nanocrystalline ribbon sheet has substantially no difference at the same temperature condition.

In the case that the heat treatment temperature is less than 300° C., the nanocrystalline grains are not sufficiently produced and thus a desired permeability is not obtained. In addition, it takes a longer time for the heat treatment. Also, in a subsequent step of handling a flake treatment process, the magnetic sheet is not well flaked. In addition, in the case of exceeding 700° C., the permeability is significantly lowered by an overheat treatment. Generally, when the heat treatment temperature is low, it takes a long time for the heat treatment. In contrast, when the heat treatment temperature is high, the heat treatment time is shortened.

Figure 7:
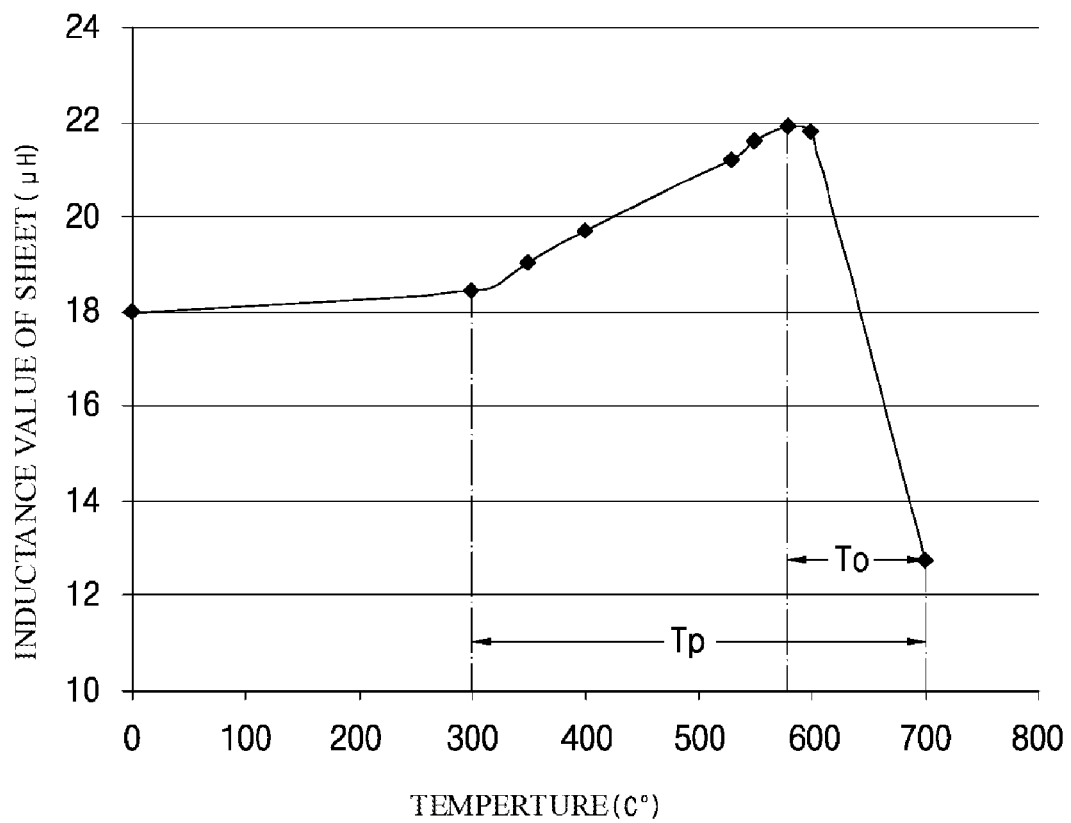
FIG. 7 is a graph illustrating the relationship between a heat treatment temperature and a magnetic permeability of a nanocrystalline sheet ribbon sheet that is used for a magnetic field shield sheet according to the present invention.

Referring to FIG. 7, when amorphous ribbon is heat treated, nanocrystalline grains will be generated from 300° C. during an increase of the heat treatment temperature, and a value of the inductance of the heat treated amorphous ribbon, i.e. the sheet increases according to an increase in temperature. When the temperature is in the range of 580° C. to 600° C., the inductance value of the sheet is increased to the maximum. Thereafter, if the sheet is overheated up to 700° C. exceeding the temperature of 580° C. to 600° C., the inductance value of the sheet is inversely proportional to the heat treatment temperature, to thus show abruptly reduced values. The amorphous ribbon exhibits the maximum inductance value between temperatures of 580° C. to 600° C. due to individual variations.

The permeability of the sheet is proportional to the inductance value. Thus, if overheating is made up to 700° C. exceeding the temperature of 580° C. to 600° C., magnetic sheets having a desired magnetic permeability can be easily manufactured by using a point that represents the characteristics of linearly decreasing the inductance value of the sheet.

In addition, if the amorphous ribbon is overheated in an overheating treatment temperature interval (To) between 580° C. to 700° C., embrittlement becomes strong. Thus, when a flake treatment process is executed in a subsequent step, the amorphous ribbon is easily flaked. Furthermore, since the overheating treatment temperature interval (To) is wide, and if the sheet is heat treated by using the wide overheating treatment temperature interval (To), the magnetic permeability of the shield sheet may be widely selected.

The permeability of the surface of the heat-treated sheet can be obtained by measuring the inductance value of the sheet under the conditions of 100 kHz and 1 V in an LCR meter by using of a coil of 12.1 μH, and then converting the measured inductance value of the sheet into the permeability of the surface of the heat-treated sheet.

In the case of the polymeric sheet, the inductance value of 15 μH is obtained, and in the case of the heatless treatment Fe-based amorphous sheet, the inductance value of 19.5 μH is obtained.

Since the heat treatment is made in the range of 300° C. to 700° C. in the present invention, the heat-treated nanocrystalline ribbon sheet exhibits the inductance value in the range of 13 μH to 21 μH. In the case that the heat-treated nanocrystalline ribbon sheet is used for the magnetic field shield sheet for a digitizer, the nanocrystalline ribbon sheet is heat treated to have the inductance value of 13 μH to 21 μH, preferably, of 15 μH to 21 μH, to thereby select a desired magnetic permeability. In the case that the nanocrystalline ribbon sheet whose inductance value is 13 μH to 15 μH is used for a shield sheet, the magnetic permeability is low and thus the sensitivity of the electronic pen is low, but the geomagnetic sensor has the low magnetic permeability to thus be used without correction, and does not indicate the magnetic hysteresis phenomenon according to the change in the geomagnetic field to thus prevent the azimuth error caused by the hysteresis from occurring.

Subsequently, a flake treatment process is performed with respect to one or two pieces of the heat treated nanocrystalline ribbon sheets 2, at a state where a protective film 1 is attached on one side thereof, and a double-sided tape 3 attached with a release film 4 is attached on the other side thereof (S14).

In the case that the stacked nanocrystalline ribbon sheets 21-24 are stacked in a two-layer form, the double-sided tape 3a is inserted between the ribbon sheets 21-24, to thus enable mutual adhesion of the ribbon sheets 21-24.

Figure 8:
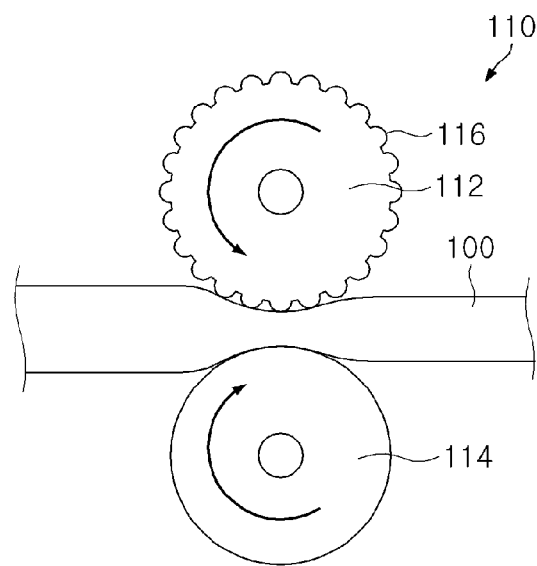
FIGS. 8 and 9 are cross-sectional views showing a flake treatment process of a laminate sheet according to the present invention, respectively.
Figure 9:
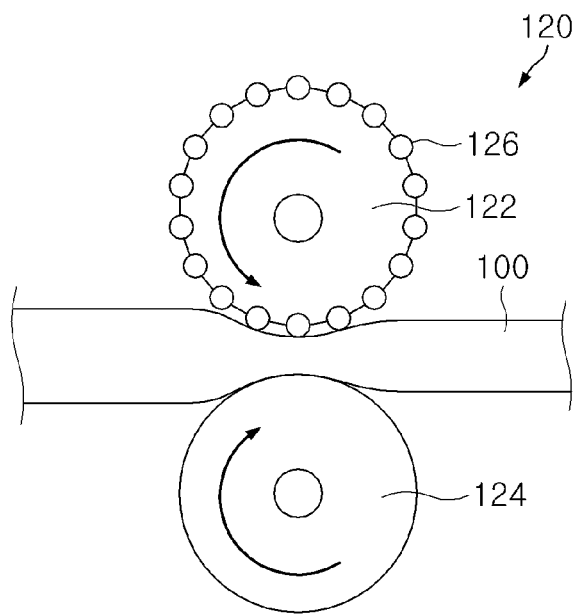

The flake treatment process is executed by allowing the laminate sheet 100 that is obtained by sequentially stacking, for example, the protective film 1, the nanocrystalline ribbon sheet 2, the double-sided tape 3, and the release film 4, to pass through first and second flake devices 110 and 120 illustrated in FIGS. 8 and 9, to thereby separate the nanocrystalline ribbon sheet 2 into a number of fine pieces 20. In this case, a plurality of the separated fine pieces 20 are maintained to keep a separated state by first and second adhesive layers 12 and 31 that are bonded to both sides of the nanocrystalline ribbon sheet 2 as shown in FIG. 10.

For example, as shown in FIG. 8, an available first flake device 110 may consist of a metal roller 112 on the outer surface of which a plurality of irregularities 116 are formed, and a rubber roller 114 that is disposed in opposition to the metal roller 112. As shown in FIG. 9, a second flake device 120 may be composed of a metal roller 122 on the outer surface of which a plurality of spherical balls 126 are mounted, and a rubber roller 124 that is disposed in opposition to the metal roller 122.

Figure 10:
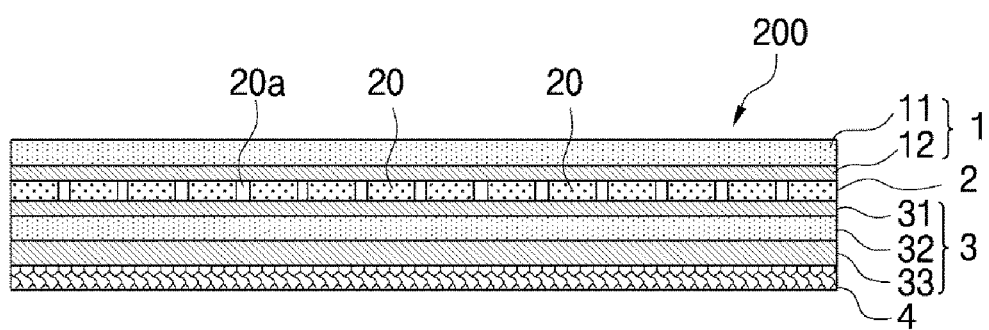
FIG. 10 is a cross-sectional view showing a state where a laminate sheet is flake-treated according to the present invention.

Thus, when the laminate sheet 100 is passed through the first and second flake devices 110 and 120, the nanocrystalline ribbon sheet 2 is separated into a number of the fine pieces 20 and gaps 20a are formed between the fine pieces 20, as shown in FIG. 10.

Since the fine pieces 20 of the nanocrystalline ribbon sheet 2 are formed to have a size of a range of several tens micrometers (μm) to 3 millimeters (mm), preferably, to have a size of a range of several hundred micrometers (μm) to 1 millimeters (mm), a demagnetizing field is made to increase to thereby remove a hysteresis loss and to thus heighten a uniformity of the permeability of the sheet.

Further, the flake treatment process of the nanocrystalline ribbon sheet 2 may reduce the surface area of the fine pieces 20 and prevent a heat generation problem caused by an eddy current that is produced by an alternating-current magnetic field.

The flake treated laminate sheet 200 has the gaps 20a between fine pieces 20. Thus, when the water is penetrated into the gaps 20a, the nanocrystalline ribbon sheet is oxidized and the appearance of the nanocrystalline ribbon sheet is poor and the shield performance is degraded.

Further, in the case that only a flake treatment process is performed, the fine pieces 20 are in contact with each other along the flow of the fine pieces 20, to accordingly increase the size of the fine pieces 20 and to thus cause a problem that the eddy-current loss increases.

Furthermore, the flake treated laminate sheet 200 may have non-uniformity caused on the surface of the sheet during performing the flake treatment process, and stabilization of the flake treated ribbon is needed.

Thus, the flake treated laminate sheet 200 undergoes a laminating process for flattening, slimming, and stabilization of the sheet 200, while simultaneously filling the adhesive into the gaps 20a of the fine pieces 20 (S15). As a result, water penetration is prevented, and at the same time all sides of the fine pieces 20 are surrounded by the adhesive, to thereby separate the fine pieces 20 from one another and reduce the eddy current.

Figure 11:
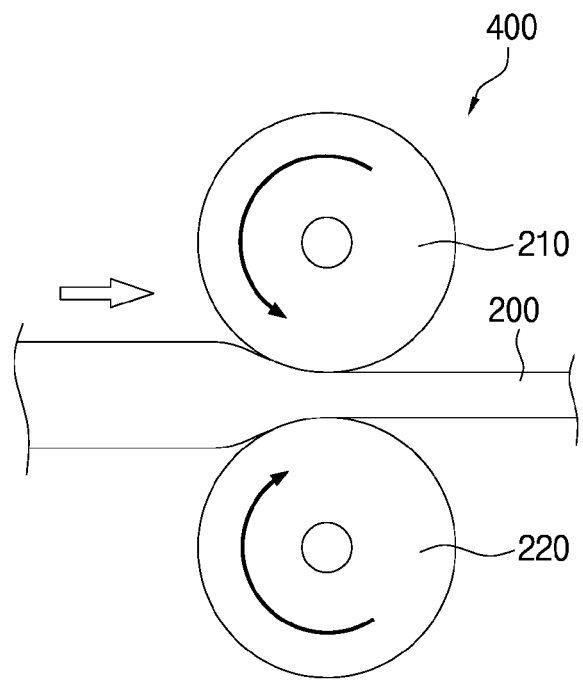
FIGS. 11 and 12 are cross-sectional views showing a laminating process of a flake-treated laminate sheet according to the present invention, respectively.
Figure 12:
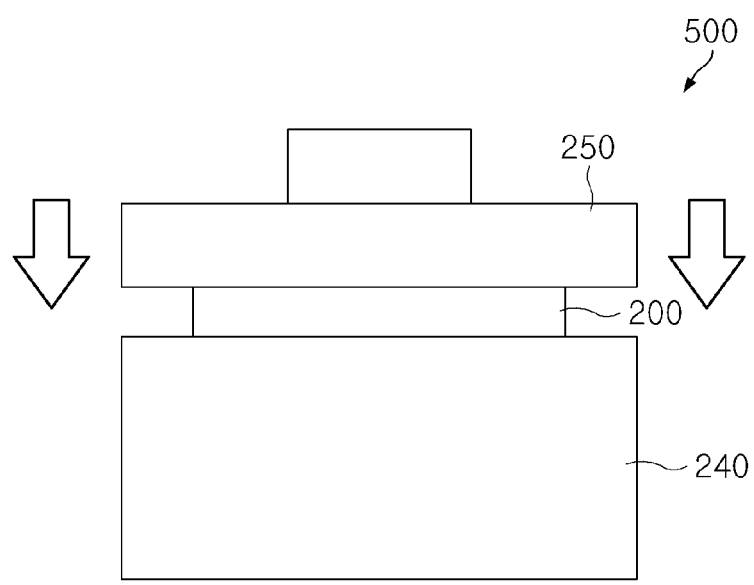

As shown in FIG. 11, a laminating device 400 for the laminating process may employ a roll press type including a first pressing roller 210 and a second pressing roller 220 that is disposed at a predetermined distance from the first pressing roller 210, between which the flake treated laminate sheet 200 passes. As shown in FIG. 12, a laminating device 500 for the laminating process may employ a hydraulic press type including a lower pressing member 240 and an upper pressing member 250 that is vertically movably disposed on the upper side of the lower pressing member 240.

When the flake treated laminate sheet 200 is heated at room temperature or at a temperature of 50° C. to 80° C., and then is passed through the laminating device 400 or 500, a first adhesive layer 12 of the protective film 1 is pressed, while some of the adhesive of the first adhesive layer 12 are introduced into the gaps 20a to seal the gaps 20a. Simultaneously, the double-sided tape 3 is pressed, while some of the adhesive of the second adhesive layer 31 are introduced into the gaps 20a to seal the gaps 20a.

Here, the first adhesive layer 12 and the second adhesive layer 31 may be formed by using an adhesive that can be deformed at the time of being pressed at room temperature, or may be formed by using a thermoplastic adhesive that can be thermally deformed by applied heat.

In addition, the first adhesive layer 12 and the second adhesive layer 31 preferably have a thickness of at least 50% when compared to the thickness of the nanocrystalline ribbon so as to sufficiently fill the gaps 20a between the fine pieces 20.

Further, the interval between the first pressure roller 210 and the second pressure roller 220 and the interval between the upper pressing member 250 and the lower pressing member 240 when the upper pressing member 250 is in a lowered state, are preferably formed of a thickness of 50% or less when compared to the thickness of the laminate sheet 200, so that the adhesives of the first adhesive layer 12 and the second adhesive layer 31 can be introduced into the gaps 20a.

Any device of performing the pressing of the laminate sheets 100 and 200 and the flake treatment process, can be used in the present invention.

Figure 13:
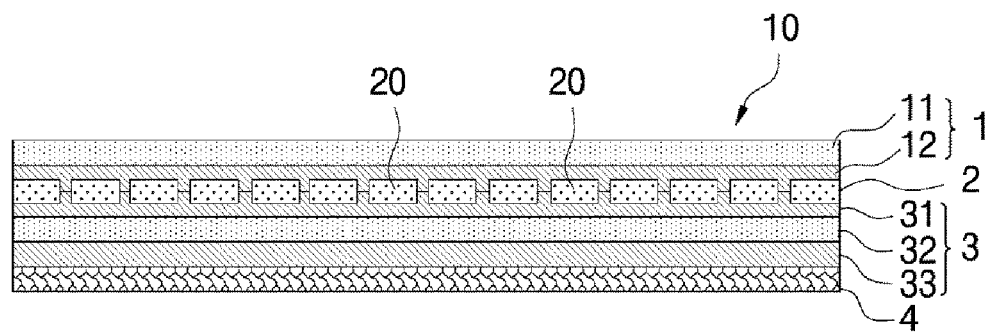
FIG. 13 is a cross-sectional view showing a state where a magnetic field shield sheet for a portable terminal device according to a first embodiment of the present invention has been flake-treated and then laminated.

As shown in FIG. 13, when the laminating process is completed, an electromagnetic wave absorbing sheet 10 according to the present invention may have a structure that the first adhesive layer 12 and the second adhesive layer 31 partially fill the gaps 20a between the fine pieces 20 at a state where the nanocrystalline ribbon sheet 2 is separated into the fine pieces 20, to thereby prevent the oxidation and the flow of the nanocrystalline ribbon sheet 2.

Finally, the magnetic field shield sheet 10 or 10b having undergone the laminating process is stamped into a rectangular shape of the size corresponding to a digitizer 54 of FIG. 17 so as to be produced into products (S16).

In the embodiment, it has been described with respect to the case that a sheet of the protective film 1 is adhered to one side of the magnetic sheet 2 and then the flake treatment process and the laminating process are executed, but the protective film 1 may be damaged by the flake treatment process. Thus, preferably, a temporary protective film for protecting the protective film 1 is attached on top of the protective film 1 before performing a treatment process, and then the temporary protective film on the surface of the magnetic sheet 2 is peeled off and removed after completion of the treatment process.

Humidity Test

A humidity test was conducted for 120 hours at temperature of 85° C. and humidity of 85% with respect to the magnetic field shield sheet 10 obtained in accordance with the invention and the laminate sheet 200 that has undergone the flake process but does not pass through the lamination process.

Figure 14A:
FIG. 14A is an enlarged photograph of a magnetic field shield sheet that has not passed through a laminating process after having performed a flake treatment process, but has undergone a humidity test.
Figure 14B:
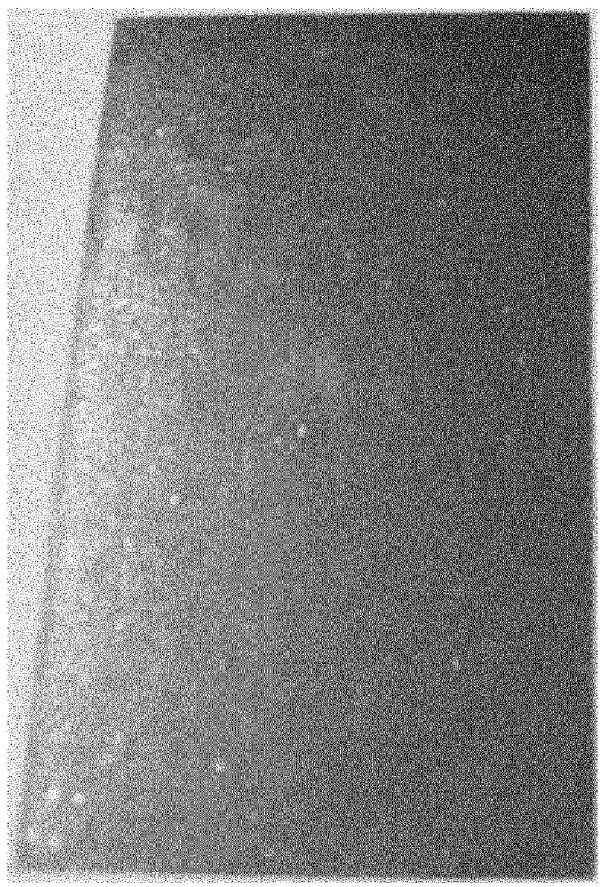
FIG. 14B is an enlarged photograph of a magnetic field shield sheet that has passed through a laminating process after having performed a flake treatment process and has undergone a humidity test, according to the present invention.

As a result, as shown in FIG. 14A, in the case of the laminate sheet 200 where only the flake-treatment was processed, it can be seen that water is penetrated into the gaps between fine pieces when the amorphous ribbon has been separated into a large number of fine pieces and then the amorphous ribbon is oxidized, and thus the appearance of the amorphous ribbon was changed. However, it can be seen that the magnetic field shield sheet 10 in accordance with the present invention shows the appearance that does not change as shown in FIG. 14B.

Figure 15A:
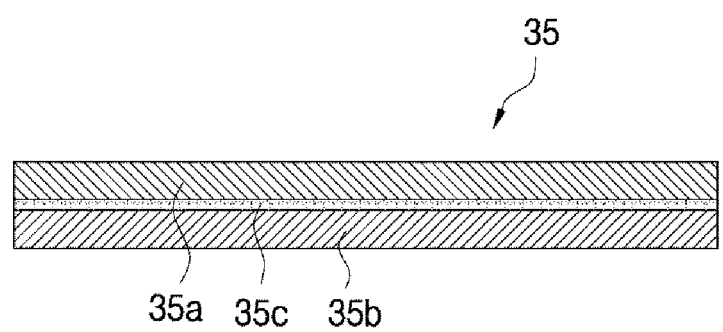
FIGS. 15A to 15C are a cross-sectional view, a plan view, and a perspective view showing a hybrid magnetic field shield sheet that is configured by using different materials having different magnetic permeability according to a third example of the present invention.
Figure 15B:
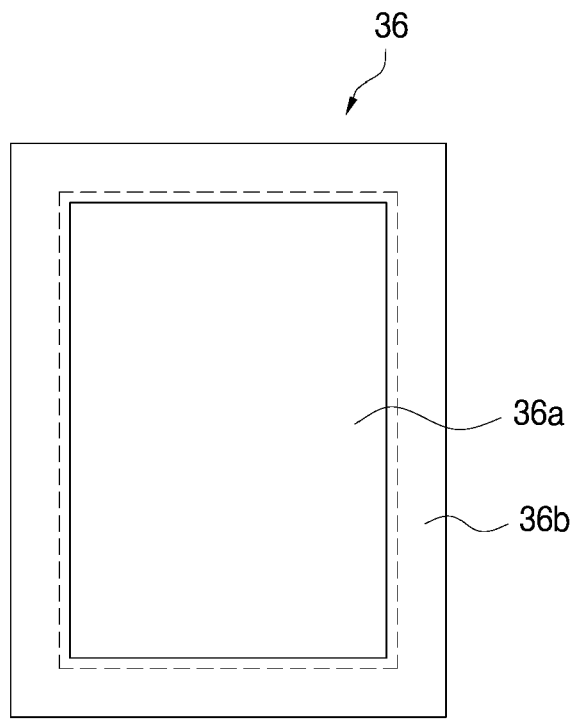
Figure 15C:
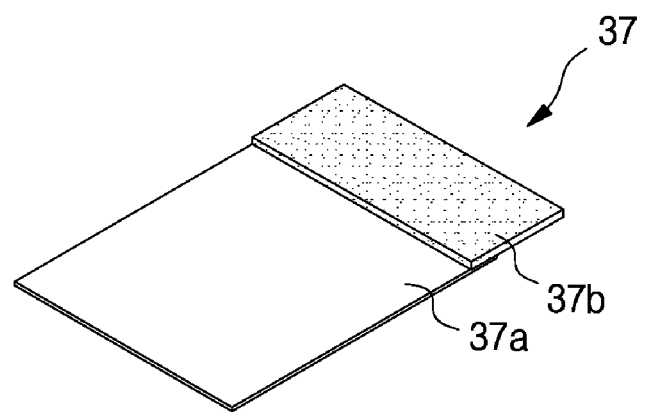

The magnetic field shield sheet 10b of the two-layer structure illustrated in FIGS. 3A and 3B according to the second example of the present invention is configured by using the same nanocrystalline ribbon sheets 21-24 as the magnetic sheets, but the magnetic field shield sheet according to the present invention may be configured by using a hybrid type thin magnetic sheet made of different materials as in the case of the third example of the present invention illustrated in FIGS. 15A to 15C.

As shown in FIG. 15A, a thin film magnetic sheet 35 according to the third example of the present invention can be configured in a hybrid form in which a bonding layer 35c is inserted and combined between a first magnetic sheet 35a of a high permeability and a second magnetic sheet 35b of a permeability lower than that of the first magnetic sheet 35a.

A nanocrystalline ribbon sheet consisting of the above-described nanocrystalline alloy or nanocrystalline alloy, a permalloy sheet having an excellent soft magnetic characteristic, or a MPP (Moly Permalloy Powder) sheet can be used as the first magnetic sheet 35a.

The second magnetic sheet 35b may be formed of a polymer sheet consisting of a magnetic powder of a high permeability such as an amorphous alloy powder, soft magnetic powder, or a Sendust, and a resin.

In this case, the amorphous alloy powder has a composition selected from the group consisting of for example, Fe—Si—B, Fe—Si—B—Cu—Nb, Fe—Zr—B and Co—Fe—Si—B, and preferably is formed of an amorphous alloy powder comprising one or more amorphous alloys.

Further, in the case that both a near field communications (NFC) function and a wireless charging function are employed in a portable terminal, the hybrid-type thin film magnetic sheet 35 is formed by using an amorphous ribbon sheet and a ferrite sheet with low frequency dependence that are laminated and stacked one over another, as the first and second magnetic sheets 35a and 35b, as shown in FIG. 15A. Accordingly, it is possible to solve both the near field communications (NFC) function and the wireless charging function by using the ferrite sheet for the magnetic field shield for the NFC and by using the amorphous ribbon sheet for the digitizer.

Further, the hybrid-type thin film magnetic sheet 36 may be formed by using a certain area of a nanocrystalline ribbon sheet at a center of the hybrid-type thin film magnetic sheet 36, as a first magnetic sheet 36a, and by combining a second annular magnetic sheet 36b that surrounds the whole of the first magnetic sheet 36a on the outside of the first magnetic sheet 36a into a polymer sheet or a ferrite loop, as shown in FIG. 15B. That is, the polymer sheet or the ferrite having a relatively smaller permeability than the nanocrystalline ribbon sheet is formed in a loop form and is arranged in the outer block of the nanocrystalline ribbon sheet. As a result, the present invention can shield the magnetic field applied to the digitizer, while minimizing an influence upon the geomagnetic sensor 60.

In addition, referring to FIG. 15C, the hybrid type thin magnetic sheet 37 according to the third example of the present invention is configured by including first and the second magnetic sheets 37a and 37b of different areas. The first magnetic sheet 37a is formed of a nanocrystalline ribbon sheet of a larger area than the second magnetic sheet 37b, and the second magnetic sheet 37b is formed of a magnetic sheet having a higher permeability than the nanocrystalline ribbon sheet on one side of the first magnetic sheet 37a, for example, a heatless treatment Fe-based amorphous sheet with a width of about 2-3 mm. That is, the first magnetic sheet 37a and the second magnetic sheet 37b are combined in a hybrid form, to thus form the hybrid type thin magnetic sheet 37.

In the case of forming the hybrid type thin magnetic sheet 37, the second magnetic sheet 37b may be overlapped with the first magnetic sheet 37a, or may be partially overlapped with the first magnetic sheet 37a and extended from one end of the first magnetic sheet 37a. Otherwise, the second magnetic sheet 37b may be extended on a flat plane from one end of the first magnetic sheet 37a. In the case that the magnetic field shield sheet using the hybrid type thin magnetic sheet 37 is applied to the portable terminal device 50, the second magnetic sheet 37b consisting of the Fe-based amorphous sheet is mounted to be disposed at a remote place from the geomagnetic sensor 60 disposed in a main circuit board 57 of FIG. 17.

The second magnetic sheet 37b consisting of a high permeability Fe-based amorphous sheet is used in a range capable of minimizing an influence on the geomagnetic sensor 60, and the high permeability magnetic field shield sheet plays a role of assisting to absorb electromagnetic waves required to perform the digitizer function, that is, improves sensitivity of the electronic pen by increasing a transfer rate of a magnetic flux.

Meanwhile, the hybrid type thin magnetic sheets 37 according to the third example of the present invention shown in FIG. 15C employs the second magnetic sheet 37b having the higher permeability than the first magnetic sheet 37a. However, the second magnetic sheet 37b has the lower permeability than the first magnetic sheet 37a.

That is, the first magnetic sheet 37a is composed of a nanocrystalline ribbon sheet, and the second magnetic sheet 37b is composed of a polymer sheet. The second magnetic sheet 37b having a low magnetic permeability is mounted to be disposed at a near place from the geomagnetic sensor 60 disposed in the main circuit board 57 of FIG. 17. As a result, the present invention can shield the magnetic field applied to the digitizer, while minimizing an influence upon the geomagnetic sensor 60.

Figure 16:
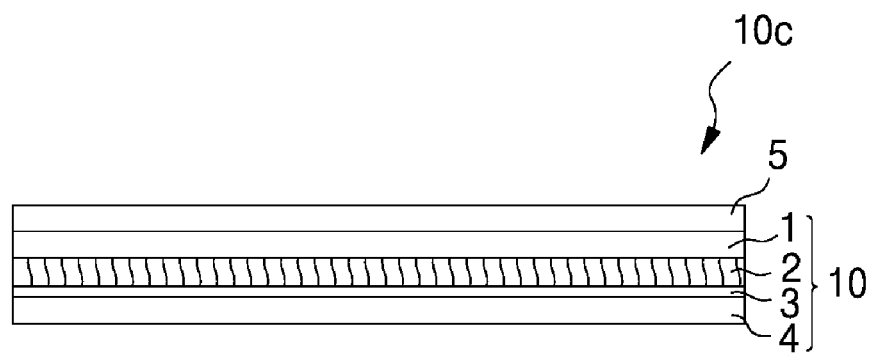
FIG. 16 is a cross-sectional view showing a magnetic field shield sheet for a digitizer having an electromagnetic wave shielding function according to a fourth example of the present invention.

Meanwhile, FIG. 16 shows a shield sheet having a function of shielding an electromagnetic wave according to a fourth example of the present invention.

The shield sheet 10c according to the fourth example of the present invention has a structure that a conductive sheet 5 made of a Cu or Al foil having an excellent conductivity is bonded on one side of the magnetic field shield sheet 10 according to the first example of the present invention, by using a double-sided tape or adhesive, so as to provide an additional function of shielding the electromagnetic wave. It is suitable that the conductive sheet 5 has a thickness of 5 to 100 μm, preferably, a thickness of 10 to 20 μm.

Further, the conductive sheet 5 can be possibly formed of a thin film metal layer made of one selected from Cu, Ni, Ag, Al, Au, Sn, Zn, Mn or a combination thereof, by a sputtering method, other than the conductive sheet 5 made in the form of a foil.

The shield sheet 10c having the function of shielding the electromagnetic wave, can be used to block an electromagnetic wave generated from a main body of a notebook computer such as a laptop computer from influencing a digitizer, in the case that a digitizer function is provided for the notebook computer from which the electromagnetic wave, for example, such as power source noise is severely generated.

In this case, the shield sheet 10c according to the fourth example of the present invention is attached to the back surface of a digitizer panel (PCB) throughout the double-sided tape 3 so that the conductor sheet 5 is exposed toward the main circuit board.

Meanwhile, a structure that the magnetic field shield sheet according to the present invention is applied to a portable terminal device having a digitizer function will be described below with reference to FIG. 17.

FIG. 17 is a schematic exploded perspective view of the structure that a magnetic field shield sheet according to the present invention is applied to a portable terminal device having a digitizer function.

Referring to FIG. 17, a portable terminal device 50 according to the present invention includes a touch screen panel 52, a display panel 53, a digitizer panel 54, a magnetic field shield sheet 10, a bracket 56, a main circuit board 57, and a rear cover 58 that are sequentially engaged, and an electronic pen 51 that receives power from the portable terminal device 50 in a non-contact manner to then be activated.

The portable terminal device 50 includes an integrated touch panel 52 disposed on the whole surface of an LCD or AMOLED type display panel 53, on a top surface of the portable terminal device 50, in order to act as an interface between the portable terminal device 50 and a user. The touch screen panel, for example, may be implemented in an 'On-Cell' manner just above the AMOLED display in a deposition form.

In order to implement the portable terminal device 50 having a digitizer function, the electronic pen 51 is configured to have a coil-shaped antenna and circuit elements for wireless communications therein to send and receive information to and from the portable terminal device 50 via wireless communications, to thereby receive power in a non-contact manner to thus drive the circuit elements.

To this end, the electronic pen 51 receives an alternating-current (AC) magnetic field of a band of 100 to 200 kHz generated in the portable terminal device 50 so that power is wirelessly transmitted to the electronic pen 51, and thus the internal circuit elements are driven, by employing a wireless charge function by an electromagnetic induction coupling method, and performs wireless communications between the digitizer panel 54 and the electronic pen 51 by using frequencies above 500 kHz.

Features of the electronic pen are implemented by the digitizer panel 54 disposed on the lower side of the touch screen panel 52 and the display panel 53. The digitizer panel 54 is formed of a thin metallic film. If electricity flows through the digitizer panel 54, the electromagnetic field is created. An ultra-miniature antenna coil for generating an alternating-current (AC) magnetic field is provided at the tip end portion of the electronic pen 51.

When the tip end portion of the pen 51 is made to approach the touch screen panel 52, In the case of using the digitizer function, an electromagnetic induction phenomenon occurs while the electromagnetic field that has already been formed on the digitizer panel 54 disposed below the touch screen panel 52 and the display panel 53 is transformed. Such a transformation of the electromagnetic field is detected by a sensor (not shown) disposed on one side edge of the digitizer panel 54, to thus recognize X and Y coordinates and the behavior of the pen.

In order to use the digitizer function using the electromagnetic induction phenomenon, it is necessary to shield electromagnetic fields generated from various components of a main circuit board 56 from influencing upon the digitizer panel 54. For this purpose, a magnetic field shield sheet 10 is inserted between the digitizer panel 54 and the main circuit board 57.

The magnetic field shield sheet 10 can be in close contact with the rear surface of the digitizer panel 54, by using a double-sided tape, or can detachably coupled to the rear surface of the digitizer panel 54, by using a separate fixing bracket 56.

That is, as shown in FIG. 16, in the case of a method of attaching the magnetic field shield sheet 10 on the rear surface of the digitizer panel 54, the release film 4 is removed from the lower portion of the magnetic field shield sheet 10 and the double-sided tape 3 exposed from the lower portion of the magnetic field shield sheet 10 is attached on the rear surface of the digitizer panel 54.

Further, as shown in FIG. 2, instead of a method of attaching the magnetic field shield sheet 10 on the rear surface of the digitizer panel 54, an alternative double-sided tape disposed on top of a protective film 1 of the magnetic field shield sheet 10 is attached on the rear surface of the digitizer panel 54, and the release film 4 is removed from the lower portion of the magnetic field shield sheet 10 and a finishing material (not shown) may be attached to an adhesive layer 33 of the double-sided tape 3 exposed from the lower portion of the magnetic field shield sheet 10.

Meanwhile, for implementing functions such as navigation or augmented reality, the portable terminal device is provided with the geomagnetic sensor 60 disposed on one corner of the main circuit board 57.

The magnetic field shield sheet 10 is made in size corresponding to the digitizer panel 54 so as not to affect the digitizer function. In this case, the magnetic field shield sheet 10 is formed slightly smaller than the size of the main circuit board 57, and thus it is desirable to maintain spacing of at least 2 mm between the magnetic field shield sheet 10 and the geomagnetic sensor 60 inside the portable terminal device.

Even when the magnetic field shield sheet 10 according to the invention is made to lie adjacent to the geomagnetic sensor 60 as described above, and to be used in the portable terminal device together with the geomagnetic sensor 60, an influence upon the geomagnetic sensor 60 is minimized.

As described above, the magnetic field shield sheet 10 according to the present invention includes at least one layer nanocrystalline ribbon sheet made of a nanocrystalline microstructure and flake-treated so as to be separated and/or cracked into a plurality of fine pieces, to thereby maximize a magnetic permeability for a magnetic field shield function, and simultaneously reduce a surface area of the ribbon by a flake treatment process. As a result, a demagnetizing field increases and thus magnetic saturation is not achieved.

Further, the nanocrystalline ribbon sheet 2 is flake-treated to thereby reduce the surface area of the ribbon, and to thus block a heat generation problem due to the eddy currents generated by the alternating-current (AC) magnetic field.

Meanwhile, the magnetic field shield sheet employed in the portable terminal device is built in the portable terminal device in order to shield a vertical magnetic field applied along the direction perpendicular to the magnetic field shield sheet. However, the portable terminal device can be placed in a situation where a magnetic field that includes the geomagnetic field and is much higher than the geomagnetic field is applied from the side surfaces of the magnetic field shield sheet.

When a magnetic field is applied from the outside along one side surface of a magnetic field shield sheet in the case that the conventional Fe-based amorphous ribbon sheet is applied as the magnetic field shield sheet, the magnetic field passes through along the plane of the sheet and radiates toward the opposite side to the sheet to which the magnetic field has been input. As a result, the geomagnetic sensor 60 has a difference in the intensities of the sensitivities in X, Y, and Z directions, and causes a problem that an angular error occurs.

In contrast, since the nanocrystalline ribbon sheet 2 according to the present invention is separated and/or cracked into a large number of fine pieces 20 by a flake treatment process, even in the case that a magnetic field is applied from the outside along one side surface of the nanocrystalline ribbon sheet 2, the magnetic field is attenuated while passing through the fine pieces 20, and thus does not nearly radiate toward the opposite side to the sheet to which the magnetic field has been input.

As a result, when the magnetic field shield sheet 10 having the nanocrystalline ribbon sheet 2 according to the present invention is used in a portable terminal device 50, even in the case that a magnetic field is applied along one side surface of the magnetic field shield sheet 2 from the outside, the geomagnetic sensor 60 is not nearly influenced by the magnetic field.

Figure 18:
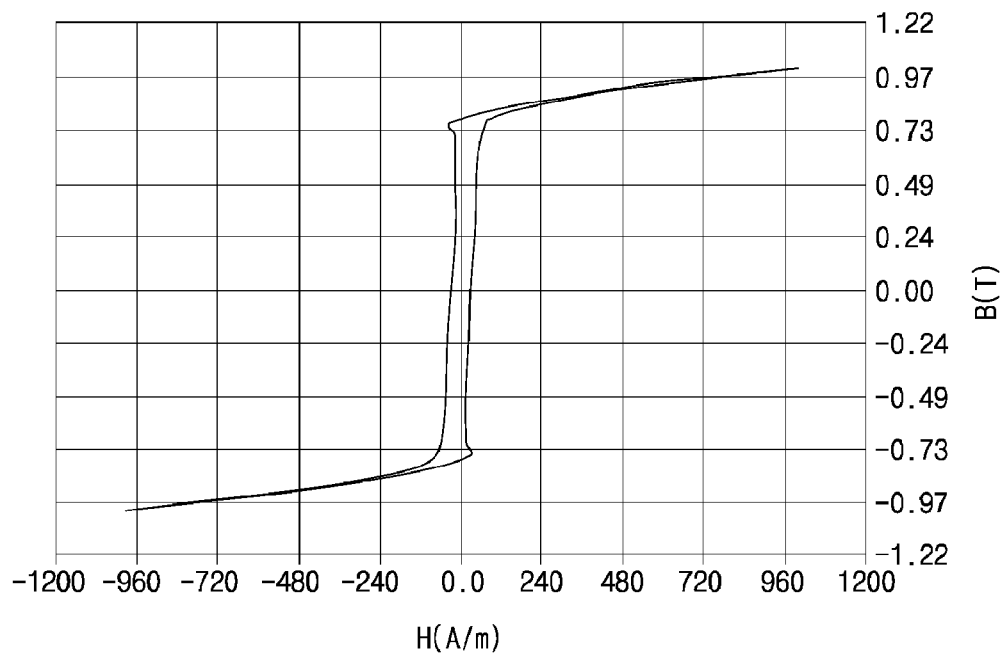
FIG. 18 is a graph showing a BH loop of a heatless treatment Fe-based amorphous ribbon sheet.

Meanwhile, when looking at the BH loop of the Fe-based amorphous ribbon sheet, i.e., the magnetic hysteresis loop, as shown in FIG. 18, a value of a saturation field (Hs) that is the minimum magnetic field for obtaining the saturation induction of the magnetic field is about 32 A/m (0.4 G), which is lower than that of the geomagnetic field having a value of about 0.5 G.

Therefore, the Fe-based amorphous ribbon sheet exhibits a magnetic hysteresis phenomenon even in the case that the geomagnetic field is changing. As a result, the geomagnetic sensor that is used in a portable terminal device in which a Fe-based amorphous ribbon sheet is applied, has a fatal disadvantage that the hysteresis correction due to the Fe-based amorphous ribbon sheet should be performed.

Figure 19:
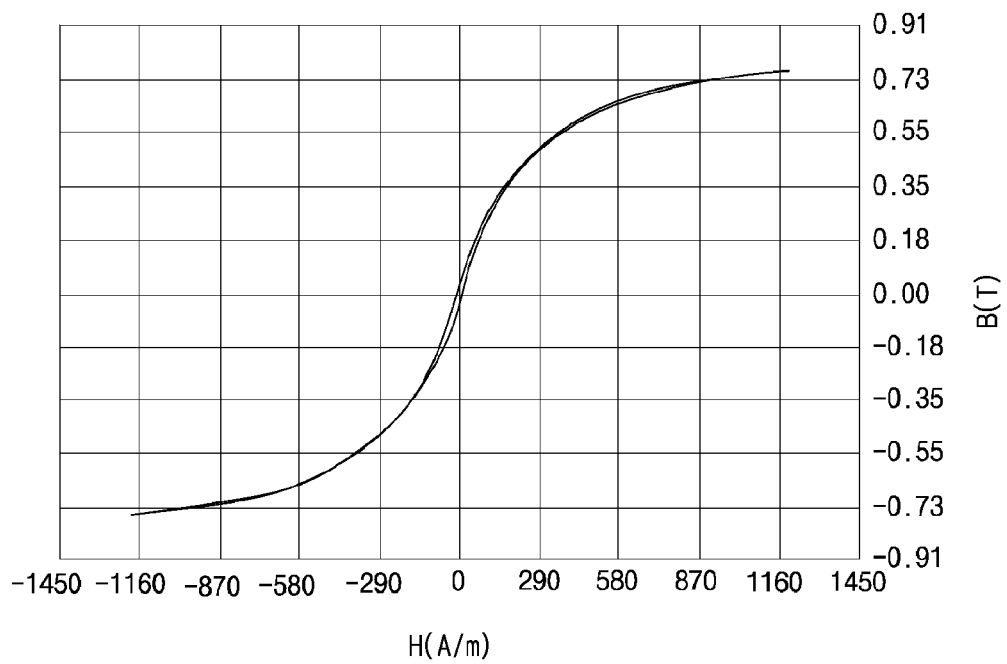
FIG. 19 is a graph showing a BH loop of a nanocrystalline ribbon sheet that is used in a magnetic field shield sheet according to the present invention.

On the contrary, when looking at the magnetic hysteresis loop of the nanocrystalline ribbon sheet 2 that is used in the magnetic field shield sheet 10 according to the present invention, as shown in FIG. 19, a value of the saturation magnetic field (Hs) is about 870 A/m (≈10.9 G), which is substantially higher than that of the geomagnetic field having a value of about 0.5 G.

Thus, even in the case that the geomagnetic field is changing, the nanocrystalline ribbon sheet 2 does not exhibit a hysteresis and changes in the initial magnetization curve. As a result, the geomagnetic sensor 60 that is mounted in the portable terminal device 50 in which the magnetic field shield sheet 10 according to the present invention is applied does not exhibit a hysteresis due to the nanocrystalline ribbon sheet 2, and thus has advantages of easy azimuth correction and a higher accuracy, when compared with the case that the heatless treatment Fe-based amorphous ribbon sheet is applied as the magnetic field shield sheet.

That is, when using the magnetic field shield sheet according to the present invention, the geomagnetic sensor does not cause a hysteresis distortion problem but cause only distortions of azimuth and sensor sensitivity. These distortions can be solved via a correction, to thereby implement a distortion-free navigation function.

In addition, as described above, in the case that the high permeability magnetic field shield sheet 10 is included in the digitizer panel 54 of the portable terminal device 10, the high permeability magnetic field shield sheet 10 blocks effects influencing upon the digitizer panel 54 due to the alternating-current (AC) magnetic field that is generated when the portable terminal device performs the wireless communications or additional features such as NFC (Near Field Communications) or RFID (Radio Frequency Identification), and at the same time plays a role of assisting the high permeability magnetic field shield sheet 10 to absorb electromagnetic waves required to perform a digitizer function, that is, increases a transfer rate of the magnetic flux, to thereby improve sensitivity of the electronic pen.

Hereinafter, embodiments of the present invention will be described in more detail. However, the following examples are nothing but illustrative of the present invention and the scope of the present invention is not limited thereto.

Comparative Example 1

Characteristics of a Geomagnetic Sensor when a Heatless Treatment Fe-Based Amorphous Ribbon Sheet is Used as a Magnetic Field Shield Sheet In Comparative Example 1, a heatless treatment Fe-based amorphous ribbon sheet of 27 μm thick was used as a magnetic sheet, and a protective film and a double-sided tape each of 10 μm thick were attached on both sides of the heatless treatment Fe-based amorphous ribbon sheet, to thereby use the heatless treatment Fe-based amorphous ribbon sheet having an inductance value 19.5 μH as a magnetic field shield sheet in a portable terminal device having a digitizer function. Then, operating characteristics of a geomagnetic sensor were measured and shown in FIGS. 20A and 20B.

Figure 20A:
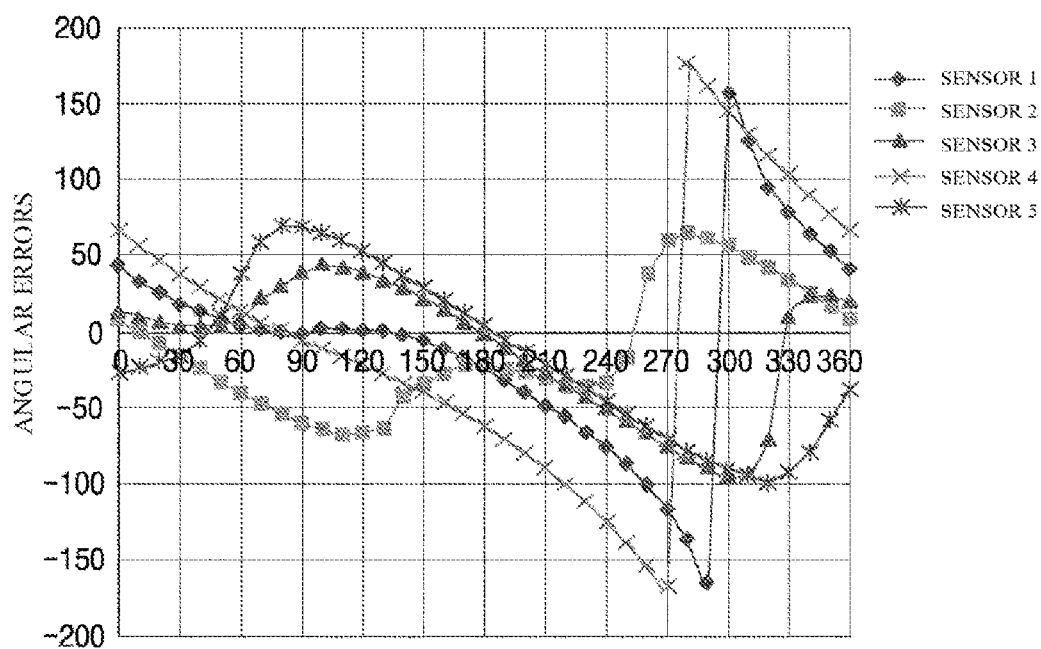
FIGS. 20A and 20B are graphs illustrating angular errors of five geomagnetic sensors and angular errors of a geomagnetic sensor that changes in accordance with the rotating directions of the geomagnetic sensor, in the case of using a heatless treatment Fe-based amorphous ribbon sheet (Comparative Example 1) whose inductance value is 19 μH, respectively.

FIG. 20A is a graph comparatively illustrating angular errors of five geomagnetic sensors in the case of using a heatless treatment Fe-based amorphous ribbon sheet of Comparative Example 1 whose inductance value is 19.5 μH, as the magnetic field shield sheet, in which the angular errors of the five geomagnetic sensors were measured at intervals of 10 degrees from 0 degrees to 360 degrees, to thereby show a degree of distortion of the azimuth of the geomagnetic sensor with respect to each of the measured azimuths of the five geomagnetic sensors.

Figure 20B:
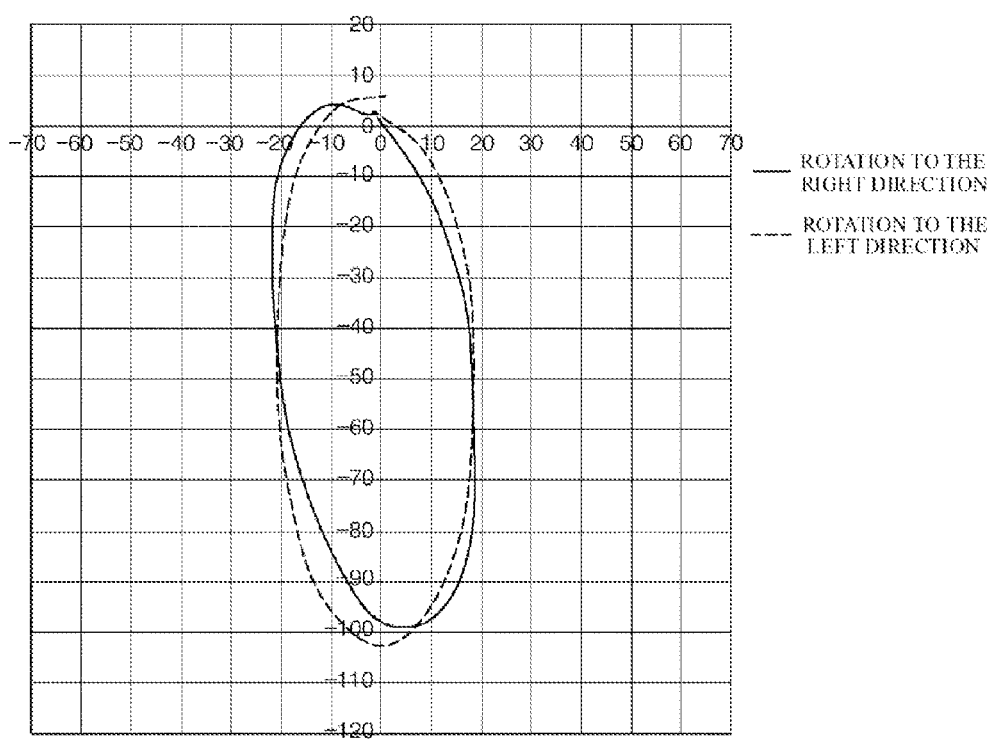

FIG. 20B is a graph illustrating angular errors of a geomagnetic sensor that changes in accordance with the rotating directions of the geomagnetic sensor, in the case of using a heatless treatment Fe-based amorphous ribbon sheet of Comparative Example 1 whose inductance value is 19.5 μH, as the magnetic field shield sheet, in which the angular errors of the geomagnetic sensor were measured at intervals of 10 degrees from 0 degrees to 360 degrees while rotating the geomagnetic sensor in the right direction (the solid line) and in the left direction (the dotted line), respectively, to thereby show a degree of distortion of the azimuth of the geomagnetic sensor with respect to each of the measured azimuths of the geomagnetic sensor.

Referring to FIG. 20A, when the heatless treatment Fe-based amorphous ribbon sheet of Comparative Example 1 was used as the magnetic field shield sheet, it can be seen that the angular errors of about 160 degrees were generated in the characteristics of some of the geomagnetic sensors and functions of some of the geomagnetic sensors were lost. Referring to FIG. 20B, it can be seen that a great hysteresis phenomenon occurred according to the direction of rotation, an offset (that is a degree where a circle is beyond the origin point) was distorted by approximately 100% in the Y-axis direction due to the influence of the heatless treatment Fe-based amorphous ribbon sheet, and a sensitivity of the X-axis was also smaller by about 60% in comparison with the Y-axis, due to the influence of the magnetic hysteresis of the heatless treatment Fe-based amorphous ribbon sheet.

Comparative Example 2

Characteristics of a Geomagnetic Sensor when a Polymer Sheet is Used as a Magnetic Field Shield Sheet In Comparative Example 2, a high permeability Sendust alloy (i.e., a Fe—Si—Al alloy) powder was mixed with a polymer material that acts as a binder, to thereby prepare a Sendust sheet of 50 μm thick having an inductance value 15 μH as a polymeric sheet, and then a protective film and a double-sided tape each of 10 μm thick were attached on both sides of the polymeric sheet. Thereafter, when the prepared sheet was used as a magnetic field shield sheet in a portable terminal device having a digitizer function, operating characteristics of a geomagnetic sensor were measured and shown in FIGS. 21A and 21B.

Figure 21A:
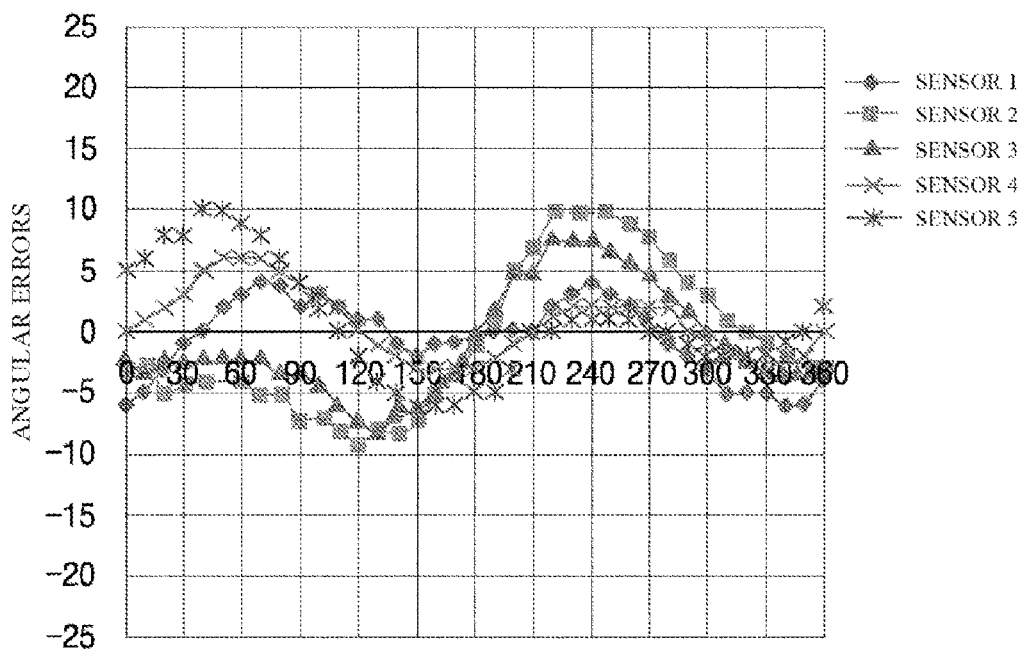
FIGS. 21A and 21B are graphs illustrating angular errors of five geomagnetic sensors and angular errors of a geomagnetic sensor that changes in accordance with the rotating directions of the geomagnetic sensor, in the case of using a polymer sheet (Comparative Example 2) whose inductance value is 15 μH, respectively.
Figure 21B:
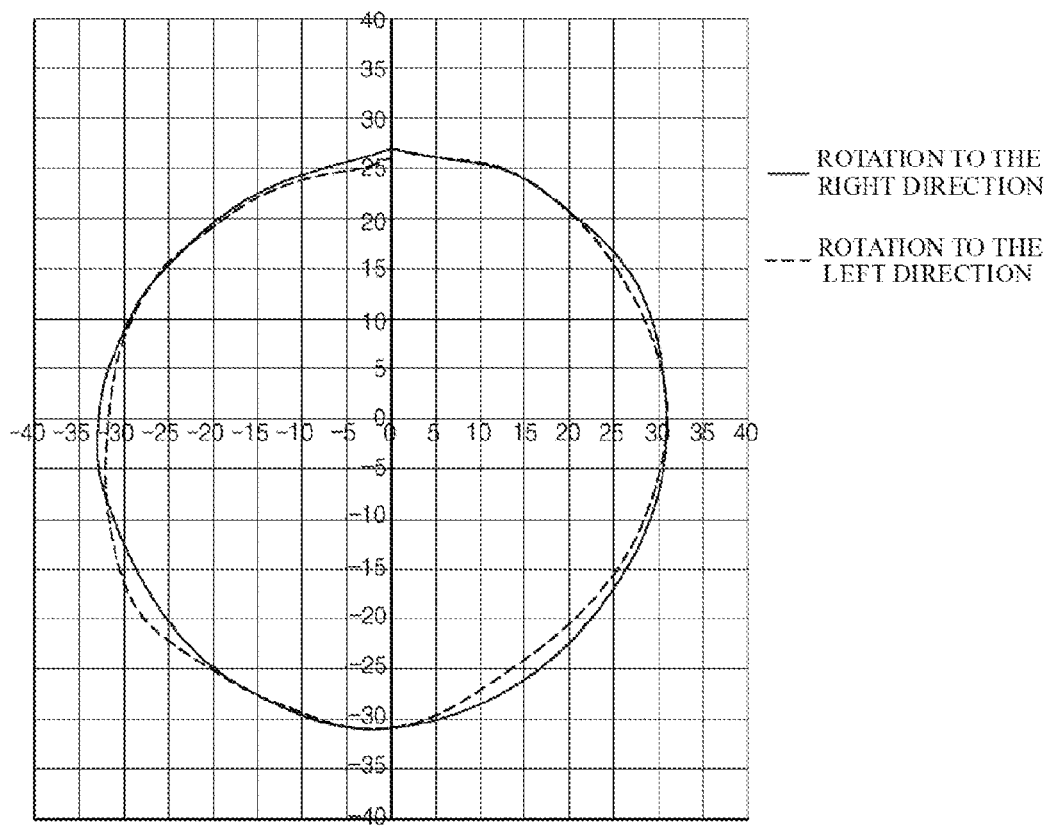

FIG. 21A is a graph comparatively illustrating angular errors of five geomagnetic sensors in the case of using a Sendust sheet of Comparative Example 2 whose inductance value is 15 μH, as the magnetic field shield sheet, and FIG. 21B is a graph illustrating angular errors of a geomagnetic sensor that changes in accordance with the rotating directions of the geomagnetic sensor, in the case of using a Sendust sheet of Comparative Example 2 whose inductance value is 15 μH, as the magnetic field shield sheet, in which the angular errors were measured in the same manner as that of Comparative Example 1.

Referring to FIG. 21A, when the Sendust sheet of Comparative Example 2 was used as the magnetic field shield sheet, it can be seen that the angular errors of about 10 degrees were generated in the characteristics of some of the geomagnetic sensors and accuracies of some of the geomagnetic sensors were a little reduced. Referring to FIG. 21B, it can be seen that a very small hysteresis phenomenon occurred according to the direction of rotation, an offset was distorted by approximately 16% in the Y-axis direction due to the influence of the Sendust sheet, and a sensitivity of the Y-axis was also smaller by about 8% in comparison with the X-axis, due to the influence of the magnetic hysteresis of the Sendust sheet.

Example 1

Characteristics of a Geomagnetic Sensor when a Nanocrystalline Ribbon Sheet is Used as a Magnetic Field Shield Sheet In Example 1, a nanocrystalline ribbon sheet of 25 μm thick and having an inductance value is 16.5 μH was used as a magnetic sheet, and a protective film and a double-sided tape each of 10 μm thick were attached on both sides of the nanocrystalline ribbon sheet, to then use the nanocrystalline ribbon sheet as a magnetic field shield sheet in a portable terminal device having a digitizer function, through flake and laminate processes. Then, operating characteristics of a geomagnetic sensor were measured and shown in FIGS. 22A and 22B.

Figure 22A:
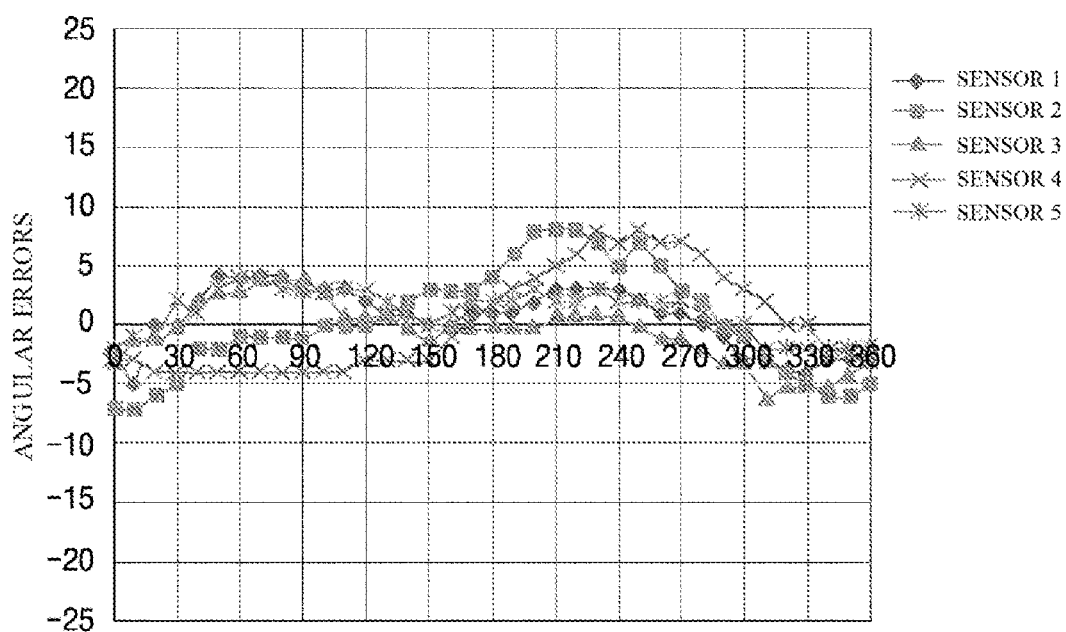
FIGS. 22A and 22B are graphs illustrating angular errors of five geomagnetic sensors and angular errors of a geomagnetic sensor that changes in accordance with the rotating directions of the geomagnetic sensor, in the case of using a nanocrystalline ribbon sheet (Example 1) whose inductance value is 16.5 μH, respectively.
Figure 22B:
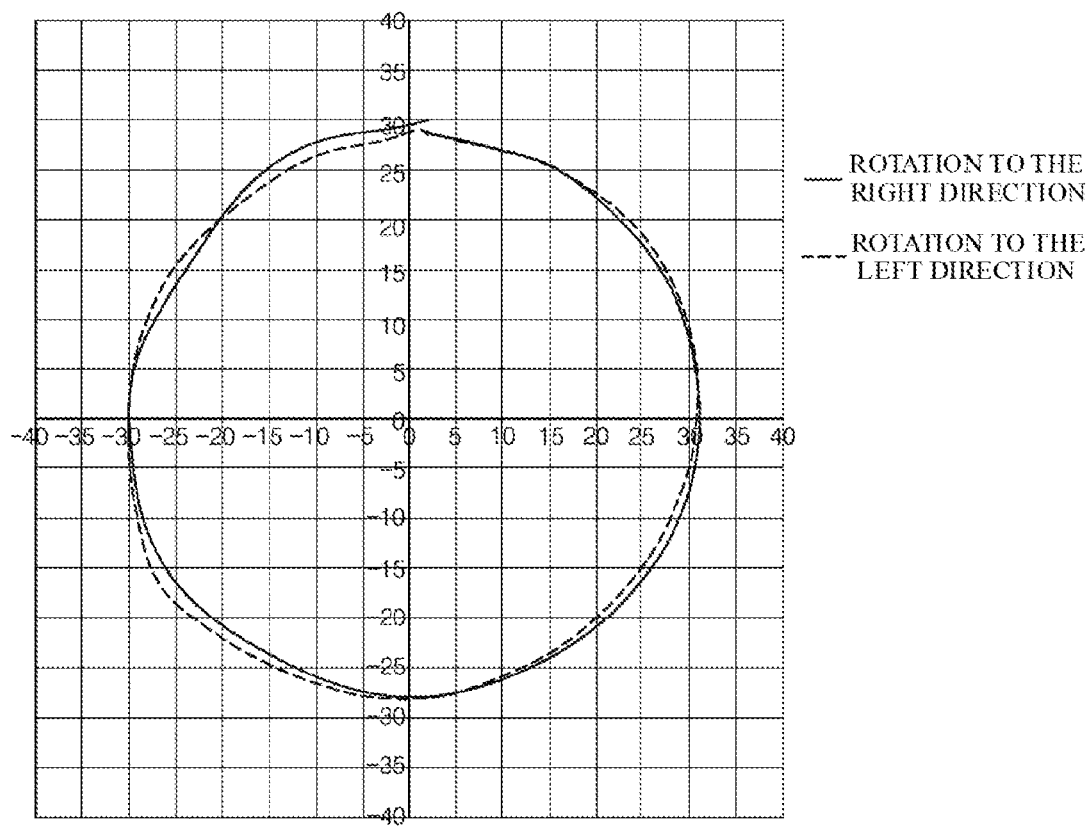

FIG. 22A is a graph comparatively illustrating angular errors of five geomagnetic sensors in the case of using a nanocrystalline ribbon sheet of Example 1 whose inductance value is 16.5 μH, as the magnetic field shield sheet, and FIG. 22B is a graph illustrating angular errors of a geomagnetic sensor that changes in accordance with the rotating directions of the geomagnetic sensor, in the case of using a nanocrystalline ribbon sheet of Example 1 whose inductance value is 16.5 μH, as the magnetic field shield sheet, in which the angular errors were measured in the same manner as that of Comparative Example 1.

Referring to FIG. 22A, when the nanocrystalline ribbon sheet of Example 1 was used as the magnetic field shield sheet, and distortions of the five geomagnetic sensors were measured, it can be seen that the angular errors of about 9 degrees were generated in the characteristics of some of the geomagnetic sensors and accuracies of some of the geomagnetic sensors were a little reduced. Referring to FIG. 22B, it can be seen that a very small hysteresis phenomenon occurred according to the direction of rotation of the nanocrystalline ribbon sheet of Example 1, an offset was distorted by approximately 7% in the Y-axis direction due to the small influence of the nanocrystalline ribbon sheet, and a sensitivity of the X-axis was also smaller by about 7% in comparison with the Y-axis, due to the small influence of the magnetic hysteresis of the nanocrystalline ribbon sheet.

Examples 2 to 4

Characteristics of a Geomagnetic Sensor when a Nanocrystalline Ribbon Sheet is Used as a Magnetic Field Shield Sheet In Examples 2 to 4, in the same manner as in Example 1, nanocrystalline ribbon sheets of 25 μm thick but respectively having inductance values are 17.5 μH, 18.5 μH, and 19.5 μH were used as magnetic sheets, and a protective film and a double-sided tape each of 10 μm thick were attached on both sides of each of the nanocrystalline ribbon sheets, to then use the nanocrystalline ribbon sheets as magnetic field shield sheets in portable terminal devices having digitizer functions, respectively, through flake and laminate processes. Then, operating characteristics of a geomagnetic sensor were measured and shown in FIGS. 23A, 23B, 24A, 24B, 25A, and 25B, respectively.

Figure 23A:
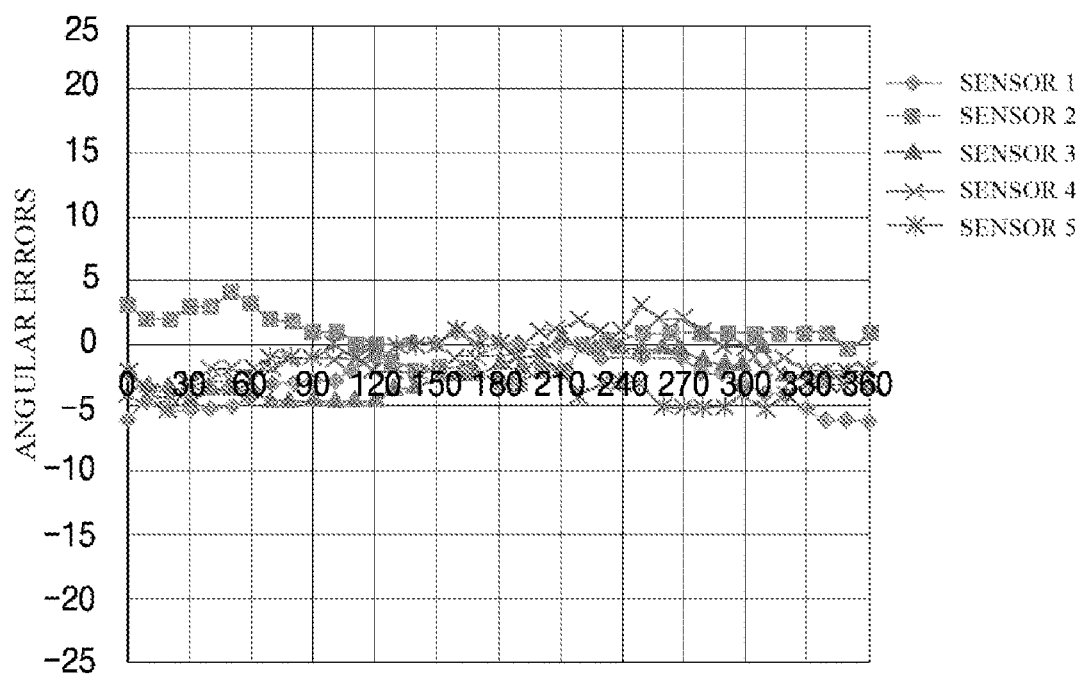
FIGS. 23A and 23B are graphs illustrating angular errors of five geomagnetic sensors and angular errors of a geomagnetic sensor that changes in accordance with the rotating directions of the geomagnetic sensor, in the case of using a nanocrystalline ribbon sheet (Example 2) whose inductance value is 17.5 μH, respectively.
Figure 23B:
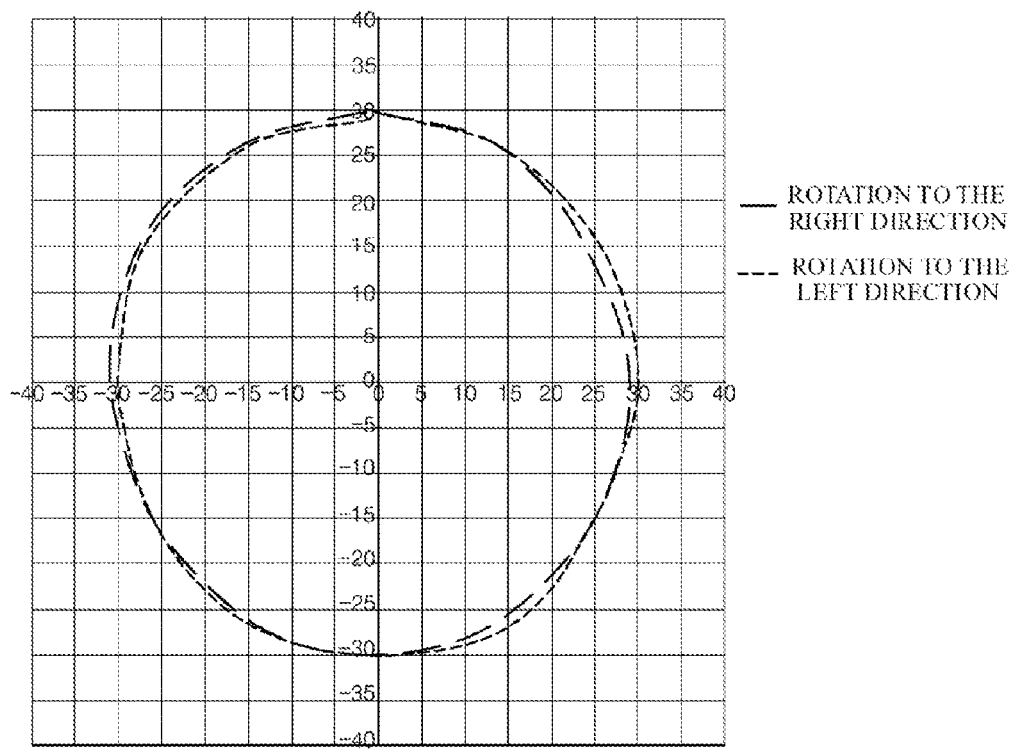
Figure 24A:
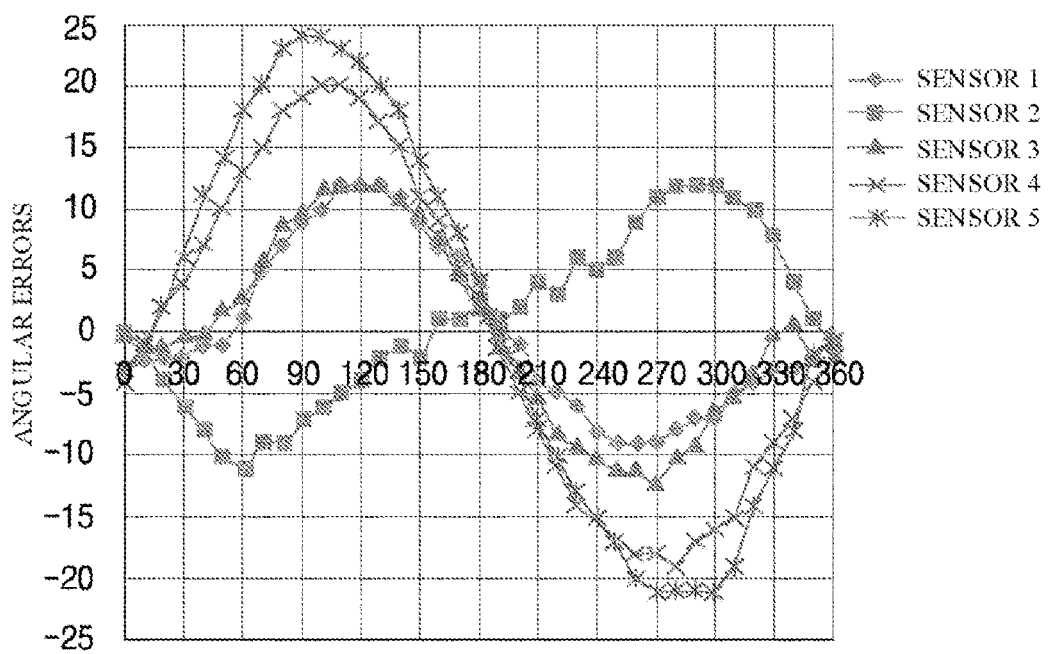
FIGS. 24A and 24B are graphs illustrating angular errors of five geomagnetic sensors and angular errors of a geomagnetic sensor that changes in accordance with the rotating directions of the geomagnetic sensor, in the case of using a nanocrystalline ribbon sheet (Example 3) whose inductance value is 18.5 μH, respectively.
Figure 24B:
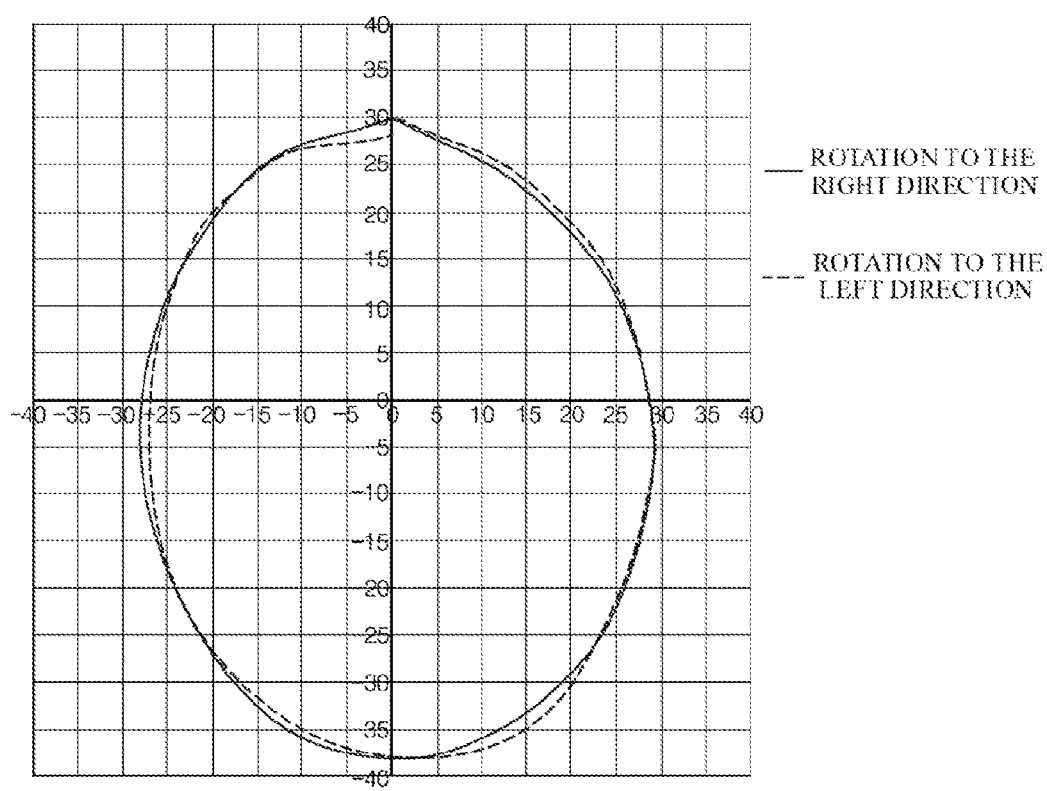
Figure 25A:
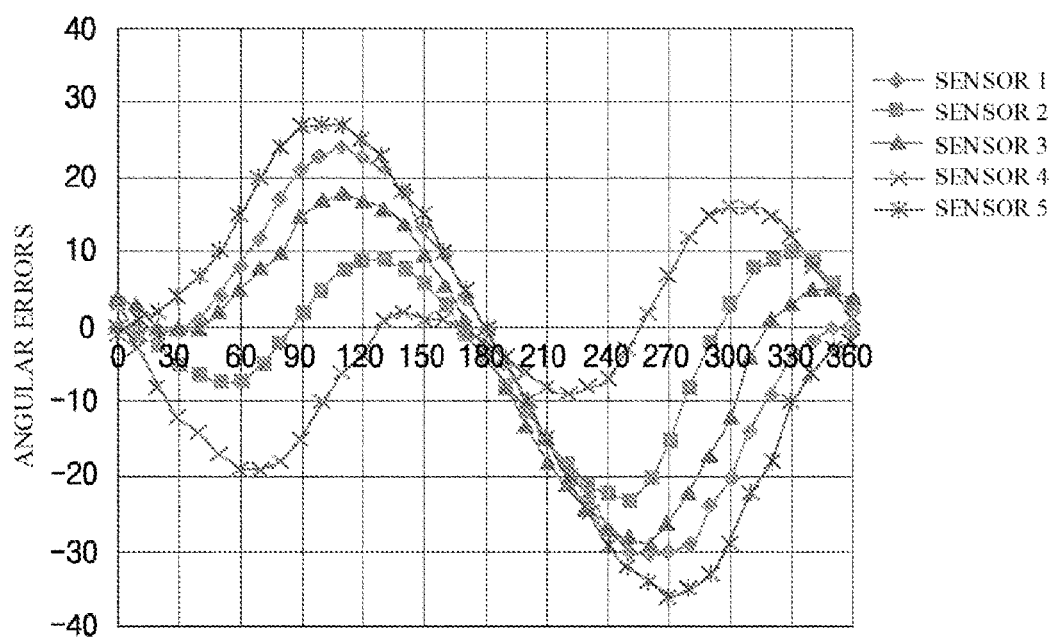
FIGS. 25A and 25B are graphs illustrating angular errors of five geomagnetic sensors and angular errors of a geomagnetic sensor that changes in accordance with the rotating directions of the geomagnetic sensor, in the case of using a nanocrystalline ribbon sheet (Example 4) whose inductance value is 19.5 μH, respectively.
Figure 25B:
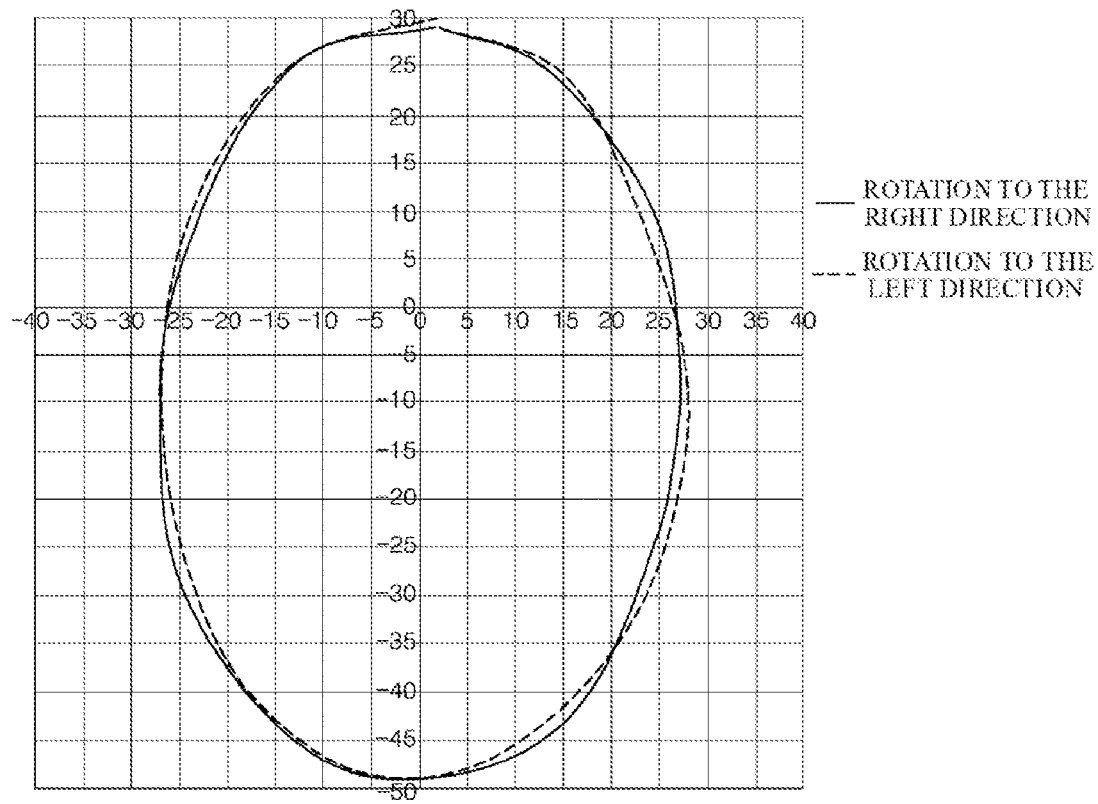

FIGS. 23A, 24A and 25A are graphs comparatively illustrating angular errors of five geomagnetic sensors in the case of using nanocrystalline ribbon sheets of Examples 2 to 4 whose inductance values are 17.5 μH, 18.5 μH, and 19.5 μH, as the magnetic field shield sheets, respectively, and FIGS. 23B, 24B, and 25B are graphs illustrating angular errors of a geomagnetic sensor that changes in accordance with the rotating directions of the geomagnetic sensor, in the case of using nanocrystalline ribbon sheets of Examples 2 to 4 whose inductance values are 17.5 μH, 18.5 μH, and 19.5 μH, as the magnetic field shield sheets, respectively.

When distortions of the five geomagnetic sensors were measured, it can be seen that the angular errors of about 6 degrees were generated in the characteristics of some of the geomagnetic sensors as shown in FIG. 23A in Example 2, and accuracies of some of the geomagnetic sensors were excellent; the angular errors of about 24 degrees were generated in the characteristics of some of the geomagnetic sensors as shown in FIG. 24A in Example 3, and accuracies of some of the geomagnetic sensors were significantly reduced (which represents an error change rate of 3/20 when compared with Comparative Example 1); and the angular errors of about 35 degrees were generated in the characteristics of some of the geomagnetic sensors as shown in FIG. 25A in Example 4, and accuracies of some of the geomagnetic sensors were considerably reduced (which represents an error change rate of 7/32 when compared with Comparative Example 1).

When looking at a hysteresis that changes in accordance with the rotating directions of the geomagnetic sensor, in the case of using the nanocrystalline ribbon sheets of Examples 2 to 4, respectively, it can be seen that a very small hysteresis phenomenon occurred, an offset was distorted by approximately 2% in the Y-axis direction due to the small influence of the sheet, and a sensitivity was also smaller by about 2% or less between the X-axis and the Y-axis, due to the small influence of the sheet, in Example 2, as shown in FIG. 23B; a very small hysteresis phenomenon occurred, an offset was distorted by approximately 15% in the Y-axis direction due to the small influence of the sheet, and a sensitivity of the X-axis was also smaller by about 18% in comparison with the Y-axis, due to the small influence of the sheet, in Example 3, as shown in FIG. 24B; and a very small hysteresis phenomenon occurred, an offset was distorted by approximately 26% in the Y-axis direction due to the small influence of the sheet, and a sensitivity of the X-axis was also smaller by about 30% in comparison with the Y-axis, due to the small influence of the sheet, in Example 4, as shown in FIG. 25B.

Accordingly, when the angular errors of the geomagnetic sensors as well as the hysteresis that changes according to the rotation direction of the geomagnetic sensor are compared with those of Comparative Examples having the same inductance value as Examples of the present invention, in the case of using the nanocrystalline ribbon sheet according to Examples of the present invention, it appeared that the sheets of the present invention were excellent in terms of all the hysteresis, offset and sensitivity.

In the case that the nanocrystalline ribbon sheet according to the present invention is configured by employing a sheet of an inductance value (permeability) of 18 μH that is a little smaller than the heatless treatment Fe-based amorphous ribbon sheet of Comparative Example 1, the geomagnetic sensor was not nearly influenced. As a result, the nanocrystalline ribbon sheets having inductance values in the range of 15 μH to 18 μH do not almost cause angular errors to occur in geomagnetic sensors, so as to be used immediately without correction of an algorithm.

Further, the nanocrystalline ribbon sheet having a high inductance value (permeability) in the range of 18 μH to 21 μH according to the present invention can be used through correction of an algorithm since no magnetic hysteresis is present, differently from the heatless treatment Fe-based amorphous ribbon sheet of Comparative Example 1.

(Characteristics of Pen Activation Distance for Specific Sheets)

Further, it was investigated whether an electronic pen was activated in a certain distance from a display surface (that is, reinforced glass) of a portable terminal device with respect to Examples 1 to 4 and Comparative Examples 1 and 2, and the results are shown in Table 1.

The above experiments were conducted at the states where the magnetic field shield sheets of Examples 1 to 4 were used instead of a polymer sheet in a digitizer that was implemented by using the polymer sheet having an inductance value of 15 μH.

TABLE 1

|  | Inductance value (μH) | Pen activation distance (mm) |
| --- | --- | --- |
| Comparative Example 1 | 19.5 | 15-20 |

TABLE 1-continued

|  | Inductance value (μH) | Pen activation distance (mm) |
| --- | --- | --- |
| Comparative Example 2 | 15 | 0 |
| Example 1 | 16.5 | 2 |
| Example 2 | 17.5 | 5 |
| Example 3 | 18.5 | 10 |
| Example 4 | 19.5 | 15-20 |

As described above, when the nanocrystalline ribbon sheet is used as a magnetic field shield sheet in the portable terminal device having a digitizer function, it can be seen that sensitivity of a signal that an electronic pen transmits is increased according to an increase of an inductance (that is, permeability) in the nanocrystalline ribbon sheet, and the electronic pen is activated in a non-contact state, that is, performance of the electronic pen is improved.

In the present invention, the electronic pen can be made active in the non-contact state with respect to the glass substrate of the display, to thereby improve durability of the display and the electronic pen, and to thus be able to develop a different function by using a digitizer function of a non-contact manner.

(Frequency Characteristics for Sheets)

Figure 26:
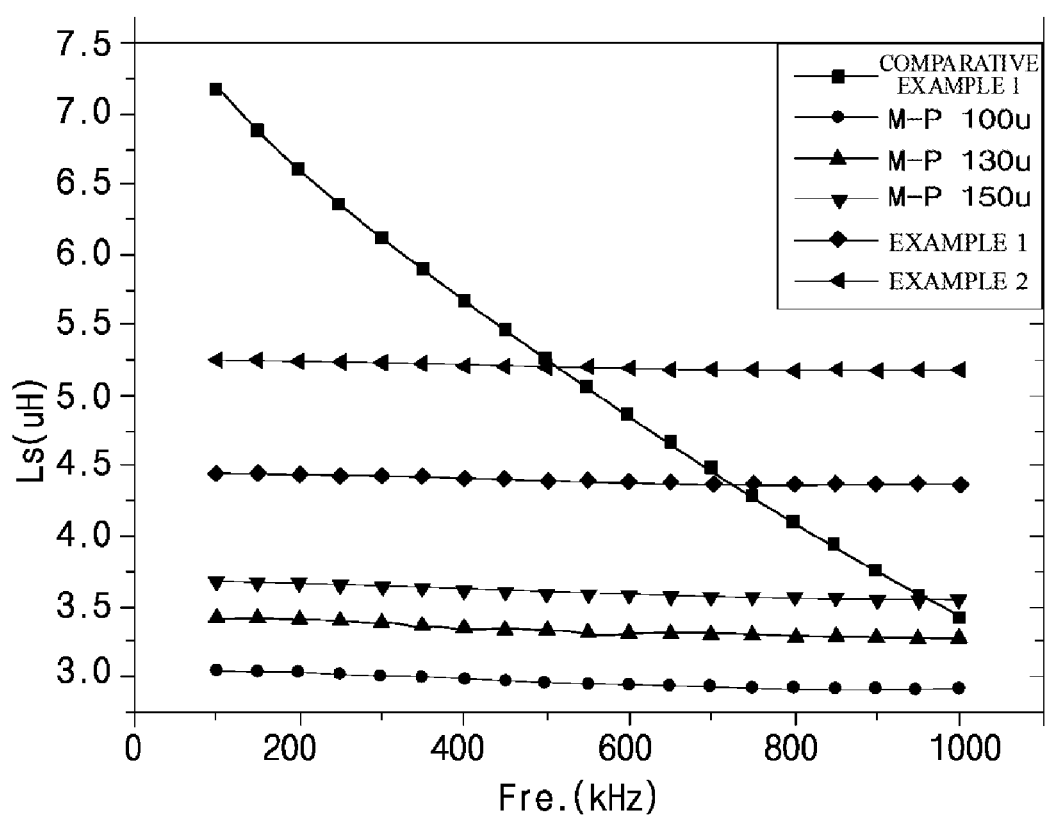
FIG. 26 is a graph showing the change in the frequency-inductance for a Fe-based amorphous ribbon sheet (Comparative Example 1), a metal powder sheet, nanocrystalline ribbon sheets (Examples 1 and 2) of the present invention.

In order to see frequency characteristics with respect to a permeability of a magnetic field shield sheet that is implemented by using a nanocrystalline ribbon sheet according to the present invention, the inductance values of the sheet were measured by using a coil having an inductance value (Ls) of 12.1 μH, while changing frequencies from 100 kHz to 1 MHz under the condition of AC 1V in an LCR meter that is a piece of electronic test equipment used to measure the inductance (L), capacitance (C), and resistance (R) of a component, and thus the measured results are shown in FIG. 26.

Referring to FIG. 26, regarding nanocrystalline ribbon sheets having inductance values of 16.5 μH and 17.5 μH that are respectively used in the magnetic field shield sheets of the present invention (Examples 1 and 2); a heatless treatment Fe-based amorphous ribbon sheet of 19.5 μH (Comparative Example 1); a metal-powder sheet of a permeability of 100 (an inductance value of 15 μH) (M-P 100 u); a metal-powder sheet of a permeability of 130 (an inductance value of 15.4 μH) (M-P 130 u); and a metal-powder sheet of a permeability of 150 (an inductance value of 15.8 μH) (M-P 150 u), the inductance value (Ls) of each sheet was measured according to the change in frequency. As a result, in the case of the Fe-based amorphous ribbon sheet (Comparative Example 1), dependence on frequencies in the range of 100 kHz to 1 MHz appears considerably large. However, in the case of the nanocrystalline ribbon sheets (Examples 1 and 2), dependence on frequencies in the range of 100 kHz to 1 MHz is not nearly present to thus exhibit identical permeability properties. In addition, a nanocrystalline ribbon sheet having an inductance value of 16.5 μH (Example 1) also exhibits a much higher permeability characteristic than the metal-powder sheet of a permeability of 150 (an inductance value of 15.8 μH) (M-P 150 u).

Therefore, in the case of using the nanocrystalline ribbon sheets according to the present invention, permeability characteristics become good and dependence on frequencies in the low frequency range is not nearly present. The nanocrystalline ribbon sheets according to the present invention have good characteristics as shield sheets for the digitizer.

In the present invention, nanocrystalline ribbon sheets each having a nanocrystalline microstructure are stacked and used by heat treatment of amorphous alloy ribbons or strips, to thus maximize the magnetic permeability for a magnetic field shielding function, and have a value of a saturation magnetic field (Hs) higher than the geomagnetic field, through a flake treatment process, and to thereby block magnetic saturation.

As a result, the nanocrystalline ribbon sheet 2 according to the present invention does not exhibit a hysteresis even in the case of a change in the geomagnetic field, and changes in the initial magnetization curve. Accordingly, when a magnetic field shield sheet 10 employing the nanocrystalline ribbon sheet 2 is used as the magnetic field shield sheet for the digitizer, the geomagnetic sensor 60 does not generate azimuth errors caused by the hysteresis of the nanocrystalline ribbon sheet, and thus can minimize hysteresis distortion problems of the geomagnetic sensor 60.

In addition, the inventive nanocrystalline ribbon sheet 2 is flake-treated and thus significantly reduces the distortion phenomenon of the geomagnetic sensor according to an external magnetic field. As a result, even the sheets having the same inductance values of 17 μH but having not been flake-treated generate the azimuth errors of about 20 degrees. However, the sheets having been flake-treated generate the azimuth errors of about 6 degrees or less and do not affect the large impact on the geomagnetic sensors.

Accordingly, when the magnetic field shield sheet 10 employing the nanocrystalline ribbon sheet 2 according to the present invention is compared with the magnetic field shield sheet employing the conventional heatless treatment Fe-based amorphous ribbon sheet, the present invention has advantages of easy azimuth correction and a higher accuracy. In addition, when compared with the polymer sheet consisting of the magnetic powder and the binder, the present invention has a higher magnetic permeability, and thus can implement a wireless electronic pen function of a high sensitivity.

Moreover, the present invention fills a gap between fine pieces of a nanocrystalline ribbon with an adhesive by performing a flake treatment process of the nanocrystalline ribbon and then by performing a compression laminating process, to thereby prevent water penetration, and simultaneously surrounds all surfaces of the fine pieces with the adhesive (or the dielectric) to thus mutually isolate the fine pieces to thereby promote reduction of eddy currents and prevent shielding performance from falling.

In addition, the present invention sequentially performs a flake treatment process and a laminating process by using a roll-to-roll method, to thereby achieve a molding process for a sheet, to thus maintain original thickness of the sheet and to thus exhibit high productivity and inexpensive manufacturing costs.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention is applied in various portable electronic devices including a portable terminal device having a digitizer function, and blocks an effect of a magnetic field generated from various components of a main body of the portable terminal device and at the same time improves the sensitivity of an electronic pen when a digitizer feature is implemented in the portable terminal device, while minimizing an influence upon a geomagnetic sensor.

The invention claimed is:

1. A magnetic field shield sheet for a digitizer, the magnetic field shield sheet comprising:
   at least one layer thin magnetic sheet made of a nanocrystalline alloy and flake-treated so as to be separated into a plurality of fine pieces;
   a protective film that is adhered on one surface of the thin magnetic sheet via a first adhesive layer provided on one side of the protective film; and
   a double-sided tape that is adhered on the other surface of the thin magnetic sheet via a second adhesive layer provided on one side of the double-sided adhesive tape,
   wherein the thin magnetic sheet has a value of a saturation field (Hs) higher than a geomagnetic field.

2. The magnetic field shield sheet according to claim 1, wherein the thin magnetic sheet is obtained by heat treating an amorphous ribbon at a temperature of 300° C. to 700° C. and a B—H loop that is a curve between a magnetic flux density and a magnetic field intensity of the thin magnetic sheet is changed in an initial magnetization curve.

3. The magnetic field shield sheet according to claim 2, wherein the amorphous ribbon is heat-treated in a temperature range of 600° C. to 700° C., and has an inductance value in the range of 13 to 21 μH.

4. A magnetic field shield sheet for a digitizer, the magnetic field shield sheet comprising:
   at least one layer thin magnetic sheet made of a nanocrystalline alloy and flake-treated so as to be separated into a plurality of fine pieces;
   a protective film that is adhered on one surface of the thin magnetic sheet via a first adhesive layer provided on one side of the protective film; and
   a double-sided tape that is adhered on the other surface of the thin magnetic sheet via a second adhesive layer provided on one side of the double-sided adhesive tape,
   wherein the thin magnetic sheet comprises:
   nanocrystalline ribbon sheets which are stacked with a multi-layer structure; and
   double-sided tapes inserted between the adjacent two nanocrystalline ribbon sheets, and
   wherein the nanocrystalline ribbon sheet of each layer is made of a pair of nanocrystalline ribbon sheets that are connected in a butting manner, and two pair of adjacent nanocrystalline ribbon sheets are disposed in a direction which is perpendicular to each other.

5. A magnetic field shield sheet for a digitizer, the magnetic field shield sheet comprising:
   at least one layer thin magnetic sheet made of a nanocrystalline alloy and flake-treated so as to be separated into a plurality of fine pieces;
   a protective film that is adhered on one surface of the thin magnetic sheet via a first adhesive layer provided on one side of the protective film;
   a double-sided tape that is adhered on the other surface of the thin magnetic sheet via a second adhesive layer provided on one side of the double-sided adhesive tape; and
   an auxiliary magnetic sheet that is overlapped in an annular form on one side or an outer periphery of the thin magnetic sheet, and that has a magnetic permeability lower or higher than the thin magnetic sheet.

6. A magnetic field shield sheet for a digitizer, the magnetic field shield sheet comprising:
- at least one layer thin magnetic sheet made of a nanocrystalline alloy and flake-treated so as to be separated into a plurality of fine pieces;
- a protective film that is adhered on one surface of the thin magnetic sheet via a first adhesive layer provided on one side of the protective film; and
- a double-sided tape that is adhered on the other surface of the thin magnetic sheet via a second adhesive layer provided on one side of the double-sided adhesive tape,
- wherein the thin magnetic sheet comprises:
- a nanocrystalline ribbon sheet;
- a polymer sheet that is stacked on the nanocrystalline ribbon sheet and has a lower permeability than the nanocrystalline ribbon sheet; and
- an adhesive layer that mutually bonds the nanocrystalline ribbon sheet and the polymer sheet and fills gaps between the fine pieces.

7. A magnetic field shield sheet for a digitizer, the magnetic field shield sheet comprising:
- at least one layer thin magnetic sheet made of a nanocrystalline alloy and flake-treated so as to be separated into a plurality of fine pieces;
- a protective film that is adhered on one surface of the thin magnetic sheet via a first adhesive layer provided on one side of the protective film; and
- a double-sided tape that is adhered on the other surface of the thin magnetic sheet via a second adhesive layer provided on one side of the double-sided adhesive tape,
- wherein some of the first adhesive layer and the second adhesive layer are filled into the gaps between the fine pieces.

8. The magnetic field shield sheet according to claim 1, wherein the fine pieces are formed of several tens of micrometers ($\mu$m) to 3 mm in size.

9. A magnetic field shield sheet for a digitizer, the magnetic field shield sheet comprising:
- at least one layer thin magnetic sheet made of a nanocrystalline alloy and flake-treated so as to be separated into a plurality of fine pieces;
- a protective film that is adhered on one surface of the thin magnetic sheet via a first adhesive layer provided on one side of the protective film;
- a double-sided tape that is adhered on the other surface of the thin magnetic sheet via a second adhesive layer provided on one side of the double-sided adhesive tape; and
- a conductive sheet that is formed of a thin plate on an outer surface of the protective film to thus shield an electromagnetic wave.

10. The magnetic field shield sheet according to claim 3, wherein the inductance value is in the range of 16.5 to 17.5 $\mu$H.

* * * * *